(12) United States Patent
Omori et al.

(10) Patent No.: US 7,544,024 B2
(45) Date of Patent: Jun. 9, 2009

(54) COATED CUTTING INSERT AND MANUFACTURING METHOD THEREOF

(75) Inventors: Naoya Omori, Itami (JP); Yoshio Okada, Itami (JP); Minoru Itoh, Itami (JP); Norihiro Takanashi, Itami (JP); Shinya Imamura, Itami (JP)

(73) Assignee: Sumitomo Electric Hardmetal Corp., Hyogo (JP)

( * ) Notice: Subject to any disclaimer, the term of this patent is extended or adjusted under 35 U.S.C. 154(b) by 0 days.

(21) Appl. No.: 11/666,159

(22) PCT Filed: Oct. 20, 2005

(86) PCT No.: PCT/JP2005/019287

§ 371 (c)(1),
(2), (4) Date: Apr. 24, 2007

(87) PCT Pub. No.: WO2006/046462

PCT Pub. Date: May 4, 2006

(65) Prior Publication Data

US 2007/0248424 A1    Oct. 25, 2007

(30) Foreign Application Priority Data

Oct. 29, 2004    (JP) .............................. 2004-316611

(51) Int. Cl.
*B23B 27/14* (2006.01)
*B23B 9/00* (2006.01)

(52) U.S. Cl. ..................................... 407/113; 407/119

(58) Field of Classification Search .......... 407/113–119, 407/11, 120; 428/216, 336, 174, 702
See application file for complete search history.

(56) References Cited

U.S. PATENT DOCUMENTS

| 5,442,981 | A * | 8/1995 | Vegh ........................... 82/1.11 |
| 6,599,062 | B1 * | 7/2003 | Oles et al. ................... 407/119 |
| 2002/0039521 | A1 | 4/2002 | Votsch et al. | |
| 2002/0187370 | A1 | 12/2002 | Yamagata et al. | |

FOREIGN PATENT DOCUMENTS

| JP | 2001-322007 | 11/2001 |
| JP | 2002-144108 | 5/2002 |
| JP | 2003-094230 | 4/2003 |
| WO | WO 02/04156 A1 | 1/2002 |

* cited by examiner

*Primary Examiner*—Willmon Fridie
(74) *Attorney, Agent, or Firm*—McDermott Will & Emery LLP

(57) ABSTRACT

The present invention relates to a coated cutting insert having a substrate, a base layer which is formed on the substrate and an indicating layer which is formed on a portion of the base layer, characterized in that in this substrate, at least one surface serves as a rake face, at least one other surface serves as a flank face, and a ridge where the rake face and the flank face cross serves as a cutting edge, the base layer has a color which is different from that of the above described indicating layer, and this indicating layer is formed on the flank face, and on the base layer over an entirety or a portion of a region excluding a region extending from the cutting edge in the vertical direction with a distance of no less than 0.2 mm and less than 3.0 mm.

10 Claims, 5 Drawing Sheets

COATED CUTTING INSERT AND MANUFACTURING METHOD THEREOF

RELATED APPLICATION

This application is a national phase of PCT/JP2005/019287 filed Oct. 20, 2005, which claims priority from Japanese Application No. 2004-316611 filed Oct. 29, 2004, the disclosures of which Applications are incorporated by reference herein. The benefit of the filing and priority dates of the International and Japanese Applications is respectfully requested.

TECHNICAL FIELD

The present invention relates to a coated cutting insert which is used in a cutting tool for cutting processing. In particular, the invention relates to a coated cutting insert which is particularly useful as a drill, an end mill, a coated insert for milling or turning, a metal saw, a gear cutting tool, a reamer, a tap or an insert for pin milling on a crankshaft, as well as to a manufacturing method thereof

BACKGROUND ART

Tools for turning and tools for milling are provided with a single or several coated cutting inserts. As shown in FIG. 1, a coated cutting insert 1 has a rake face 2 which is located on side where swarf 6 of a work material 5 is lifted at the time of cutting processing, and a flank face 3 which is located on the side which faces the work material, and the portion which corresponds to a ridge where rake face 2 and flank face 3 cross is referred to as a cutting edge 4, and becomes the center point of application for cutting the work material.

The edge of this coated cutting insert must be replaced when the lifetime is expired. In the case of an insert with only one cutting edge, the insert itself must be replaced. In the case of a coated cutting insert having several cutting edges, however, the direction can be changed several times on the same datum plane, i.e., an unused cutting edge is positioned in a cutting position, so that the insert can be used with another cutting edge. In some cases, the insert is reattached to another datum plane, so that an unused cutting edge can be used with this support.

At the site of cutting work, however, in some cases, a coated cutting insert is replaced or changed in direction before the cutting edge is used. This happens because it is not recognized whether or not the cutting edge has been used when the edge is replaced or the direction of the cutting edges is changed. Accordingly, it is necessary to carry out the above described operation after it has sufficiently been confirmed whether or not the cutting edge has been used.

As a method for easily identifying a cutting edge after use, a coated cutting insert where the rake face and the flank face have different colors has been proposed (Japanese Unexamined Patent Publication 2002-144108 (Patent Document 1)). Concretely, this coated cutting insert has a configuration where a base layer having wear resistance, referred to as anti-friction coating layer, is formed on a substrate, and an indicating layer is formed of a material that is easily worn on the flank face.

However, although a coated cutting insert having this configuration has a function of giving caution about whether or not the cutting edge has been used, the indicating layer that has been formed on the flank face easily adheres to a work material, and therefore, because the indicating layer adheres to the surface of the work material, or because cutting processing is carried out with the edge in an uneven state with work material adhering to the indicating layer, such a problem arises that the appearance and surface smoothness of the work material after cutting are poor.

Patent Document 1: Japanese Unexamined Patent Publication 2002-144108

DISCLOSURE OF THE INVENTION

Problems to be Solved by the Invention

The present invention is provided in order to solve the above described problem, and an object thereof is to provide a coated cutting insert where the function of giving caution is effectively shown without making the appearance and surface smoothness of the work material poor.

Means for Solving the Problems

In order to solve the above described problem, the present inventor conducted diligent research on the state of contact between coated cutting inserts and a work material at the time of cutting processing, discovered that when cutting edge 4 of coated cutting insert 1 makes contact with work material 5, as shown in FIG. 1, rake surface 2 thereof is placed on swarf 6 side, while flank face 3 faces work material 5, and pieces of work material 5 significantly adhere to a specific portion on this flank face 3, and further continued research on the basis of this discovery, so as to finally complete the present invention.

That is to say, the present invention relates to a coated cutting insert having a substrate; a base layer which is formed on the substrate; and an indicating layer which is formed on a portion of the base layer, characterized in that, in this substrate, at least one surface serves as a rake face, at least one other surface serves as a flank face, and a ridge where the rake face and the flank face cross serves as a cutting edge, the base layer has a color which is different from that of the indicating layer, and the indicating layer is formed on the flank face, and on the base layer over an entirety or a portion of a region (A2) excluding a region (A1) extending from the cutting edge in a vertical direction with a distance of no less than 0.2 mm and less than 3.0 mm.

Here, it is preferable that the base layer is exposed at region (A1) and the rake face, and at least one layer that constitutes the exposed base layer has compressive residual stress in at least a portion of at least one of region (A1) and the region that is on the rake face and relates to cutting, and it is preferable that the compressive residual stress is stress of which the absolute value is no less than 0.1 GPa.

In addition, it is preferable that a relation of 1.0>A/B is established, when a surface roughness Ra of region (A1) is A μm and the surface roughness Ra of the region (A2) is B μm. In addition, in that the coated cutting insert has a plurality of cutting edges.

In addition, the indicating layer can be made to be a layer which is easily worn in comparison with the base layer, and it is preferable that an outermost layer of the base layer is formed of an $Al_2O_3$ layer or a layer that includes $Al_2O_3$.

In addition, it is preferable an outermost layer of the indicating layer is formed by a layer either that is composed of at least one type of metal (element) selected from the group consisting of the elements of the IVa group, the elements of the Va group, and the elements of the VIa group in the periodic table of elements, Al, Si, Cu, Pt, Au, Ag, Pd, Fe, Co and Ni, and an alloy that includes the metal, or that is formed of a compound of at least one type of element selected from the group consisting of the elements of the IVa group, the elements of the Va group, and the elements of the VIa group in the periodic table of elements, Al and Si, and at least one type of element selected from the group consisting of carbon, nitrogen, oxygen and boron.

In addition, the substrate can be formed of any of a cemented carbide, a cermet, a high-speed steel, a ceramic, a cubic boron nitride sintered body, a diamond sintered body, a silicon nitride sintered body and a mixture of aluminum oxide and titanium carbide.

In addition, the coated cutting insert may be any of a drill, an end mill, a coated insert for milling or turning processing, a metal saw, a gear cutting tool, a reamer, a tap and an insert for pin milling on a crankshaft.

In addition, the present invention can provide a method of manufacturing a coated cutting insert having a substrate, a base layer which is formed on the substrate, and an indicating layer which is formed on a portion of the base layer, characterized by comprising the steps of: forming the base layer on the substrate; forming the indicating layer of which the color is different from that of the base layer on the base layer; and removing the indicating layer that has been formed on a region on a flank face of the substrate, including at least a region (A1) extending from a cutting edge in a vertical direction with a distance of no less than 0.2 mm and less than 3.0 mm, and on a rake face.

As described above, the coated cutting insert according to the present invention has a single or several flank faces and a single or several rake faces, and is provided with an indicating layer of which the color is different from that of the layer that is formed on the rake face (that is to say, the color of the base layer) on a certain portion of the flank face.

In this case, the indicating layer is provided so as to create as large a color contrast as possible relative to the base layer. The indicating layer that is formed on a certain portion of the flank face is provided with such properties as to leave a clear processing mark after cutting work has been carried out with the coated cutting insert for as short a period of time as possible, for example, several seconds to several minutes, in such a manner that it is at least partially worn off so as to show the base (base layer) having a different color. It is preferable, in a possible embodiment, for the indicating layer to lack wear resistance, or for it to be relatively easily worn, and to have, for example, weak adhesiveness to the base (base layer).

Meanwhile, this indicating layer may change in color immediately after the coated cutting insert is used. Furthermore, this indicating layer may change in color (including cases where an appearance as if the color has changed is given) when swarf, cutting lubricant or the like adheres thereto.

Alternatively, the indicating layer may change in color in a different manner in order to indicate that the adjacent cutting edge has already been used. The indicating layer, for example, may be heat-sensitive, so that the vicinity of the cutting edge changes in color at temperatures exceeding 200° C. In addition, it is preferable that the change in color depends on oxidation or other changes in the properties, and is irreversible. Even in the case where the adjacent cutting edge is used only for a short period of time, the indicating layer changes in color when the temperature of the certain portion on the flank face that is adjacent to this cutting edge exceeds a predetermined temperature for at least a short period of time, so that it can be clearly recognized in a continuous manner. The change in color brought about by the effects of heat occurs on the flank face that is adjacent to the used cutting edge, in addition to the portion that makes direct contact with the work material during use, and therefore, there is an advantage, such that the cutting edge can be easily recognized after use.

It can be simply and easily recognized whether or not the coated cutting insert has already been used and which cutting edges have not yet been used, based on whether or not a processing mark has been left or a change in color has been caused on the indicating layer. Namely, the indicating layer has a function of giving caution. Thus, the coated cutting insert can be appropriately replaced, or the direction thereof can be appropriately changed. In particular, it is possible to avoid cases such as failing to notice that the coated cutting insert has been used and needs to be replaced, replacing an unused coated cutting insert with a new one, setting of a used cutting edge to the cutting position when the direction of the coated cutting insert is changed, and unused cutting edges being left unused. Accordingly, maintenance of the cutting tool can be greatly simplified by using the coated cutting insert according to the present invention.

In addition, the coated cutting insert of the present invention has significant working effects, in addition to the function of giving caution, such that the indicating layer is formed only on a certain portion of the flank face, and thereby solving the problem with the conventional art, where the appearance and surface smoothness of the work material are poor after cutting processing. In coated cutting inserts having a function of giving caution according to the prior art, the indicating layer is formed at the cutting edge and the vicinity thereof, and therefore, the indicating layer adheres to the work material to impair the appearance of the work material after cutting processing and to cause deterioration in surface roughness thereof In addition, in some cases, the edge gets chipped due to increase in the cutting resistance. Therefore, not only that the type of the work material and an application are limited, but there are some cases where the work material cannot be cut using this coated cutting insert. The present invention thoroughly solves such problems, and the industrial applicability thereof is extremely wide.

Here, it is desirable that such an indicating layer is formed to have a light color, such as yellow or shiny yellowish color (for example, gold), and for the rake face (base layer) to be formed so as to have a dark color. It is desirable that the rake face (base layer) is aluminum oxide ($Al_2O_3$) or a coating layer that includes aluminum oxide. In addition, another layer may be provided on top of or beneath this $Al_2O_3$ layer.

As described above, the coated cutting insert of the present invention can be formed so as to have multiple layers, where the $Al_2O_3$ layer is a wear-resistant layer. Wear-resistant layer in the present invention means a coating layer having functions of enhancing the wear resistance of the edge at the time of use for cutting processing, and thereby, prolonging the lifetime of the tool and increasing the cutting speed.

Meanwhile, this wear-resistant layer may additionally have a supplementary surface layer. In addition, a wear-resistant layer having the same or better properties may be provided instead of the $Al_2O_3$ layer.

In order to manufacture the coated cutting insert according to the present invention, first, a coating layer that includes an $Al_2O_3$ layer as a wear-resistant layer is formed as a base layer on the entire surface of a substrate. Then, a nitride layer (such as TiN), for example, can be formed as an indicating layer as a top layer. This nitride layer may be formed so as to coat the entire surface of the base layer, and then removed from the rake face and a certain portion of the flank face.

It is particularly necessary for the nitride layer which is used as the indicating layer to be removed from region (A1) on the flank face extending from a cutting edge in a vertical direction with a distance of no less than 0.2 mm and less than 3.0 mm. This may be carried out in accordance with any method, and may be carried out in accordance with, for example, mechanical removal, concretely, a brushing operation, a barreling operation, a blast process (such as sandblasting), or the like.

In the brushing and blast process operation, also carrying out post processing simultaneously on the cutting edge, the cutting edge is made smooth. This contributes to decreasing the adhesion to the work material and prolonging the lifetime of the coated cutting insert.

EFFECTS OF THE INVENTION

The coated cutting insert of the present invention has a configuration as described above, and thereby, showing an effective function of giving caution without impairing the appearance and surface smoothness of the work material.

DESCRIPTION OF THE REFERENCE SIGNS

Figure 1:
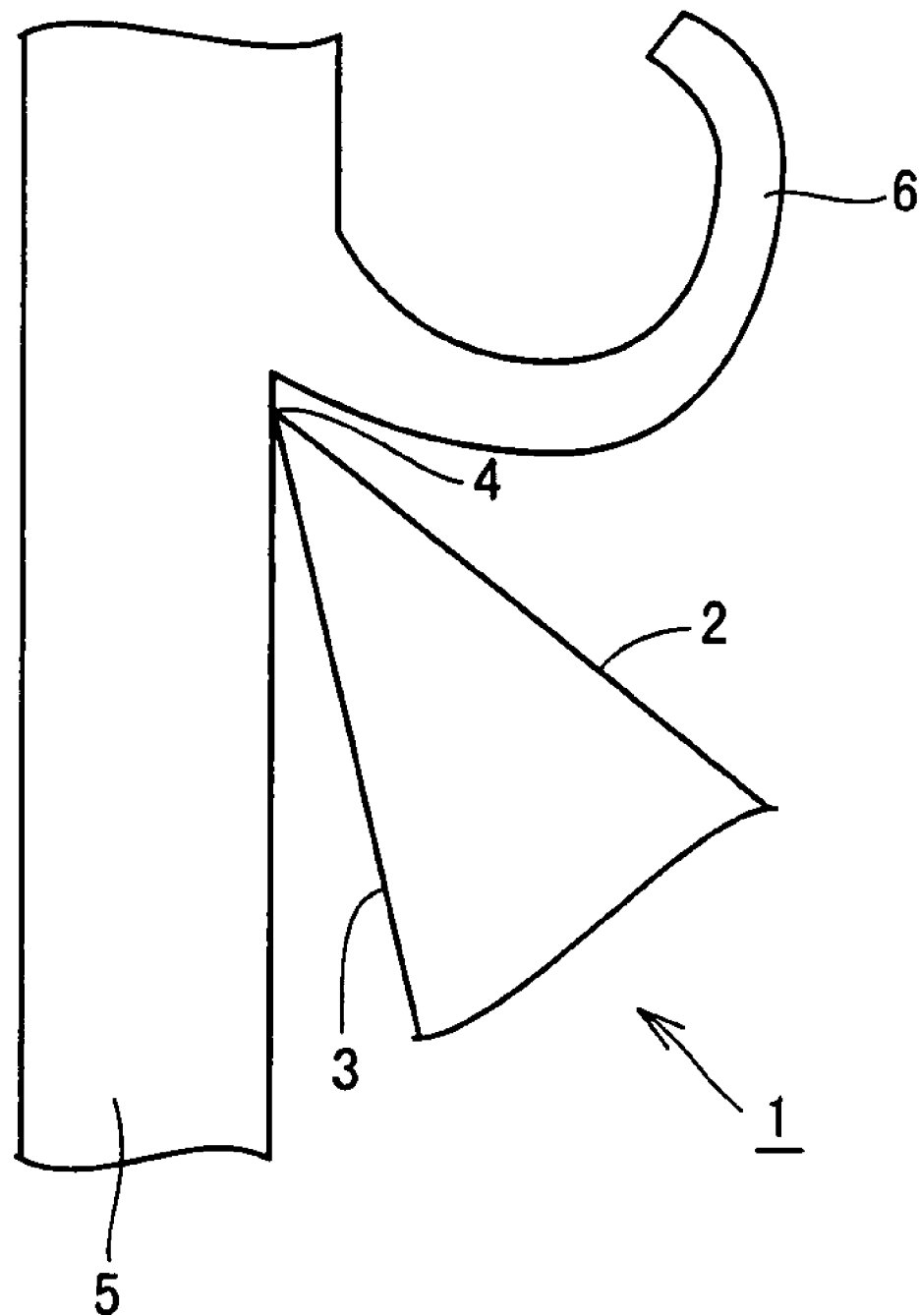
FIG. 1 is a schematic diagram showing the state of contact between a coated cutting insert and a work material at the time of cutting processing.

1: coated cutting insert, 2: rake face, 3: flank face, 4: cutting edge, 5: work material, 6: swarf, 7: through hole, 8: substrate, 9, 10: color changing zones, 11: coating, 12: base layer, 13: indicating layer

BEST MODES FOR CARRYING OUT THE INVENTION

In the following, the present invention is described in further detail. Here, in the following, embodiments are described in reference to the drawings, and parts to which the same symbols are denoted in the drawings of the present specification indicate the same or corresponding parts. In addition, all of the drawings are schematic illustrations, and the size ratio of the film thickness of the coating to the substrate and the size ratio of the radius (R) in the corners to the substrate are different from the actual product.

<Coated Cutting Insert and Substrate>

Figure 2:
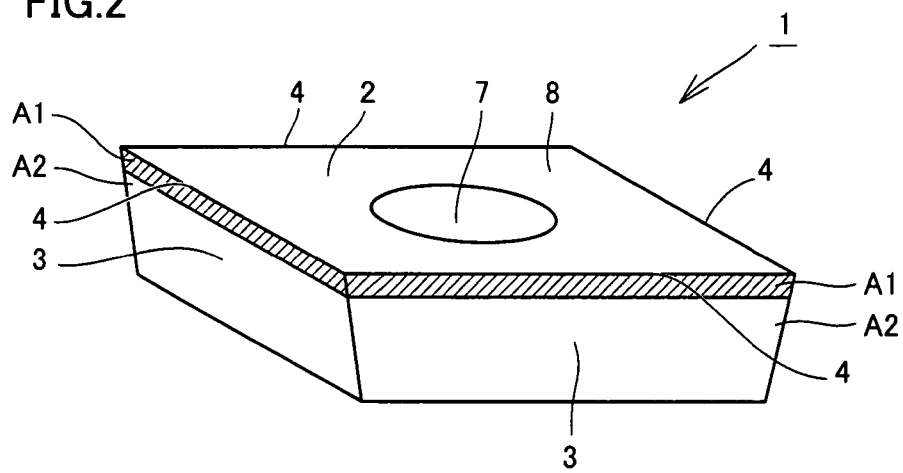
FIG. 2 is a schematic perspective diagram showing one embodiment of a coated cutting insert of the present invention before use.

A coated cutting insert of the present invention has a substrate, a base layer which is formed on the substrate, and an indicating layer which is formed on a portion of the base layer. FIG. 2 shows a coated cutting insert 1 which is formed so as to have an upper surface in square form. Coated cutting insert 1 has a substrate 8 as described above, and it is preferable for this substrate 8 to be made of, for example, a cemented carbide. Substrate 8 may be formed of, for example, sintered tungsten carbide or another cemented carbide material. In addition, it is possible to form substrate 8 of a ceramic material.

As described above, conventionally known materials as a material for the substrate (base) of coated cutting inserts can be used to form the substrate without particular limitation, and cemented carbides (for example, WC based cemented carbides composed of WC alone or combination of WC and Co and/or carbon nitride of Ti, Ta, Nb or the like), cermets (having a main component of TiC, TiN, TiCN or the like), high-speed steels, ceramics (titanium carbide, silicon carbide, silicon nitride, aluminum nitride, aluminum oxide and the like), cubic boron nitride sintered bodies, diamond sintered bodies, silicon nitride sintered bodies and mixtures of aluminum oxide and titanium carbide can be cited as examples. In addition, the surface of such a substrate (base) may be modified in quality. In the case of a cemented carbide, for example, a beta ($\beta$) removal layer may be formed on the surface thereof, and in the case of a cermet, a surface hardening layer may be formed, and the effects of the present invention can be gained when the surface is modified in quality in this manner.

In addition, the form of substrate 8 may be, for example, a polyhedron. This polyhedron may have a form having, for example, at least a bottom, a plurality of sides and an upper surface, as shown in FIG. 2, but the form of substrate 8 is not limited to such a form, and may be a polyhedron of any form. In addition, at least one surface from among the above described surfaces of this substrate 8 becomes the below described rake face, and at least another surface becomes the flank face, and the ridge where the rake face and the flank face cross becomes a cutting edge.

The coated cutting insert of the present invention may be either a type where a chip breaker is formed or a type where no chip breaker is formed. In addition, in the coated cutting insert of the present invention, a through hole 7 which is used as a fixing hole for attaching coated cutting insert 1 to a tool may be formed so as to penetrate from the top surface to the bottom surface. Another fixing means may be provided in addition to or instead of this fixing hole, if necessary.

Such a coated cutting insert of the present invention is particularly useful as a drill, an end mill, a coated insert for milling and turning, a metal saw, a gear cutting tool, a reamer, a tap and an insert for pin milling on a crankshaft.

<Rake Face, Flank Face and Cutting Edge>

In the above described substrate 8, at least one surface becomes a rake face 2, and at least another surface becomes a flank face 3, and at the same time, the ridge where rake face 2 and flank face 3 cross becomes a cutting edge 4. It is preferable for coated cutting insert 1 of the present invention to have a plurality of cutting edges 4 as this one. This is because the time and effort for replacing the entire coated cutting insert after use of one cutting edge can be reduced. Here, the rake face and the flank face in the concept of the present specification encompass corresponding faces which are located on the surface of a substrate, or on the surface or the inside of the respective layers, for example, the base layer and the indicating layer, in addition to the faces that are located on the surface of the coated cutting insert.

The above described cutting edge 4 forms the central point of application for cutting a work material. Though in FIG. 2, for example, cutting edge 4 are in linear form, the invention is not limited to this, and the cutting edge in circular form and in wave form are also possible. Here, edge processing, such as chamfering processing and/or corner rounding processing to add a radius (R) can be carried out on such a cutting edge, and in the case where the cutting edge do not form a clear ridge as a result of such edge processing, the state of the rake face and the flank faces on which this edge processing has been carried out before the edge process are assumed, so that the respective faces are geometrically extended and the ridge where two faces cross is defined as virtual ridges, which is taken as the cutting edge.

In addition, in FIG. 2, rake face 2 is shown as a flat face. The rake face may have another structure, such as a chip breaker, if necessary. The same can be said for flank faces 3. In addition, though flank faces 3 are shown as flat faces in FIG. 2, chamfering (for separating flank faces 3 into a plurality of face sections) may be carried out, and flank faces 3 may be changed so as to have a form or a curve that is different from a flat face in accordance with another method, or a chip breaker may be provided thereon, if necessary.

Cutting edge 4 may be formed in a curve or in a bent form, which is different from linear form, if necessary. In addition, as is clear from FIG. 5, edge processing, such as chamfering processing and/or corner rounding processing to add a radius (R), for example, may be carried out on such a cutting edge, as described above.

<Base Layer>

Figure 5:
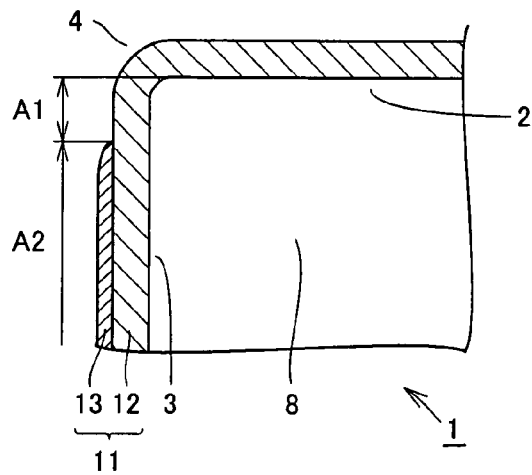
FIG. 5 is an enlarged cross sectional diagram of a portion of a cutting edge of a coated cutting insert.

Base layer 12 that is formed on the above described substrate 8 has a color that is different from that of indicating layer 13 as described later. FIG. 5 shows the structure of a coating 11 that is coated on coated cutting insert 1. Base layer 12 that extends on rake face 2 and flank face 3 is included in coating 11. As described above, base layer 12 is formed on surface of substrate 8, and this base layer 12 can be formed at least on the above described rake face 2, and furthermore, can also be formed on the above described rake face 2 and the above described flank face 3. That is to say, it is particularly preferable for base layer 12 to be formed on the entire surface of substrate 8.

More specifically, this base layer 12 is exposed on region (A1) and rake face 2 relative to indicating layer 13 as described later. That is to say, base layer 12 becomes the surface in the portion where indicating layer 13 is not formed.

In addition, it is preferable for at least one layer that forms base layer 12 in the region where this base layer 12 is exposed to have compressive residual stress in at least a portion of at least one of the above described region (A1) and the region that is on the rake face and relates to cutting. With this configuration, the edge is made tough, and chipping of the edge can be extremely effectively prevented. Here, the region that is on the rake face and relates to cutting varies depending on the form of the coated cutting insert, the type and size of the work material, the manner of cutting processing and the like, but generally means the region extending from the cutting edge with which the work material makes contact (or to which the work material is closest) to the rake face side with a width of 3 mm.

In addition, a prescription that at least one portion of at least one of the above described region (A1) and the region that is on the rake face and relates to cutting is meant to include an aspect that compressive residual stress is not provided to a portion of this region due to a variety of factors, though it is preferable for compressive residual stress to be provided throughout the entirety of this region.

Here, compressive residual stress is a type of internal stress (inherent distortion) which exists in the coating (coating layer), and means stress which can be represented by a numeral value using "−" (minus) (unit: "GPa" is used in the present invention). Therefore, the concept of large compressive residual stress shows that the absolute value of the above numeral value is great, and the concept of small compressive residual stress shows that the absolute value of the above numeral value is small. With respect to this, tensile residual stress means one type of internal stress (inherent distortion) which exists in a coating layer and can be represented by a numeral value using "+" (plus). Here, in the case where residual stress is used alone, it includes both compressive residual stress and tensile residual stress.

In addition, it is preferable for the compressive residual stress of this base layer 12 to be stress of which the absolute value is no less than 0.1 GPa, it is more preferable for it to be no less than 0.2 GPa, and it is most preferable for it to be no less than 0.5 GPa. In the case where the absolute value thereof is less than 0.1 GPa, in some cases, sufficient toughness cannot be gained, and though it is preferable, from the point of view of toughness, for the absolute value to be greater, it is not so preferable for the absolute value to exceed 8 GPa, because the coating layer itself may peel off.

In addition, at least one layer that forms the base layer in this region may have such compressive residual stress, and more preferably, at least the layer that forms the outermost layer of the base layer has such compressive residual stress. This is because such a structure is considered to contribute most to increasing in chipping preventing properties.

Here, the residual stress may be measured in accordance with any method, and can be measured, for example, in accordance with a $\sin^2 \psi$ method, using an X-ray stress measuring unit. Thus, such residual stress can be measured by determining the average value of stress measured in accordance with the $\sin^2 \psi$ method at ten arbitrary points which are included in a region that is in the base layer and where the compressive residual stress occurs (it is preferable for the points to be selected at a distance of no less than 0.1 mm from each other so as to represent the stress of the region of the layer).

The $\sin^2 \psi$ method using X-rays is widely used as the method for measuring residual stress in polycrystal materials, and the method that is described in detail in "X-ray Stress Measuring Method" (the Society of Material Science, Japan, issued by Yokendo Co., Ltd., 1981 ), pages 54 to 66, for example, may be used.

In addition, it is possible to measure the residual stress using a method using Raman spectroscopy. Raman spectroscopy has the merit of being able to locally measure a small range, for example, a spot having a diameter of 1 μm. Measurement of residual stress is generally carried out using Raman spectroscopy, and the method that is described in "Technology for Evaluating Mechanical Properties of Thin Films" (Sipec Corporation, issued in 1992), pages 264 to 271, for example, can also be adopted.

Furthermore, the residual stress can be measured using radiation light. In this case, there is the merit of being able to find the distribution of residual stress in the direction of the thickness of the base layer (coating layer).

Here, this base layer 12 can be formed in accordance with a publicly known chemical deposition method (CVD method), a physical deposition method (PVD method), a sputtering method or the like, and this formation method is not particularly limited. In the case where coated cutting insert 1 is used as a drill or an end mill, for example, it is preferable for the base layer to be formed in accordance with a PVD method where a layer can be formed without reducing the strength against bending. In addition, the film thickness of the base layer may be adjusted by controlling the time for film formation.

In addition, in the case where a base layer is formed in accordance with a publicly known CVD method, it is preferable to contain a layer formed in accordance with an MT-CVD (medium temperature CVD) method. In particular, it is optimal to contain a titanium carbon nitride (TiCN) layer having excellent wear resistance in accordance with this method. In accordance with a conventional CVD method, film formation is carried out at approximately 1020° C. to 1030° C., while in accordance with an MT-CVD method, film formation can be carried out at a relatively low temperature, for example, approximately 850° C. to 950° C., and therefore, damage to the substrate at the time of heating for film formation can be reduced. Accordingly, it is more preferable for the layer that has been formed in accordance with an MT-CVD method to be provided in proximity to the substrate. In addition, it is preferable to use a nitrile based gas, in particular, acetonitrile ($CH_3CN$), as the gas that is used for film formation, so that productivity becomes excellent. Here, in the case of a multiple layer structure where a layer that is formed in accordance with an MT-CVD method as described above and a layer that is formed in accordance with an HT-CVD (high temperature CVD, conventional CVD that is the same as described above) method are layered, adhesion between these coating layers increases, in some cases, which is preferable.

Meanwhile, the method for providing compressive residual stress as described above to base layer 12 is not particularly limited, and in the case where base layer 12 is formed in accordance with a CVD method, for example, the compressive residual stress can be provided to the region of this base layer to be provided with the compressive residual stress after the formation thereof by carrying out a process using a blasting method. Here, this process using a blasting method can be carried out on a wider region beyond the above described region (at least one of the above described region (A1) and the region that is on the rake face and relates to cutting). Meanwhile, in the case where base layer 12 is formed in accordance with a PVD method, a state where compressive residual stress is already provided is gained at the time of formation, and therefore, it is not necessary to carry out the above described process.

As described above, though a method for forming base layer 12 in accordance with a PVD method can be cited as the method for providing compressive residual stress to base layer 12, it is particularly preferable to form base layer 12 in accordance with a CVD method and provide compressive residual stress by means of a process using a blasting method, taking adhesion between base layer 12 and substrate 8 into consideration.

Here, this process using a blasting method can be carried out after the formation of base layer 12, and can also be carried out after the formation of the after-mentioned indicating layer 13 on base layer 12 also as an operation for removing this indicating layer 13 from at least one of the above described region (A1) and the region that is on the rake face and relates to cutting. When this processing method is adopted, the production efficiency of the coated cutting insert increases, which is preferable. Here, in this case, it is preferable to mask the portion where indicating layer 13 remains with a jig or the like.

Here, the above described blasting method is one type of surface processing method for removing a coating, rust, stains and the like from the surface of a work material in accordance with any of the following methods (1) to (3), and is used in a variety of industrial fields.
(1) Particles of a variety of abrasive materials are blown against the surface of a work material with compressed air.
(2) Particles of a variety of abrasive materials are sequentially shot against the surface of a work material using rotational blades.
(3) A liquid (water) containing particles of a variety of abrasive materials is jetted against the surface of a work material with high pressure.

As for the type of the above described particles of a variety of abrasive materials, steel grid, steel shot, cut wire, alumina, glass beads, silicate and the like, are generally used, and names of sandblasting, shot blasting, alumina blasting, glass beads blasting and the like may be used, depending on the type of particles.

For example, sandblasting means a method for blowing abrasive particles such as silicate (powder) against the surface of a work material with compressed air or the like, and shot blasting means a method using steel shots (usually in spherical form). In addition, wet blasting means a method for blowing a liquid (water) containing particles of an abrasive material against the surface of a work material with high pressure.

Concrete conditions for these blasting methods depend on the type and application method of the used particles of an abrasive material (abrasive grains), and metal based abrasive materials for a blasting process are prescribed in JIS ZO311: 1996 and non-metal based abrasive materials for a blasting process are prescribed in JIS ZO312: 1996. In addition, the details of shot blasting are described in JIS B6614: 1998. In the processing method using a blasting method of the present invention, any of these conditions can be adopted.

Here, as the method for providing compressive residual stress to base layer 12, blasting methods as those described above can be adopted, and in addition, a brushing method, a shot peening method, a barreling method, an ion implantation method and the like can be adopted.

Meanwhile, this base layer 12 can be formed by layering a plurality of layers, and in addition, it is preferable for the base layer to function as a wear-resistant layer. Base layer 12 can be formed of a compound of at least one type of element selected from the group consisting of the elements in the IVa group (Ti, Zr, Hf and the like), the elements in the Va group (V, Nb, Ta and the like), and the elements in the VIa group (Cr, Mo, W and the like) in the periodic table of elements, Al and Si, and at least one type of element selected from the group consisting of carbon, nitrogen, oxygen and boron, in order to have excellent performance.

Base layer 12 may be made of an $Al_2O_3$ layer, to take an example of this compound, or may include this. First, a TiN layer may be formed on substrate 8, a TiCN layer may be formed on top of this, and then, an $Al_2O_3$ layer may be formed on top of this. These three layers as a whole form base layer 12, which functions as a wear-resistant layer.

As described above, in the case where base layer 12 is formed of a plurality of layers which are layered on top of each other, it is particularly preferable for the outermost layer thereof to be formed of an $Al_2O_3$ layer or a layer that includes $Al_2O_3$. This is because $Al_2O_3$ layers and layers that include $Al_2O_3$ are excellent as a wear-resistant layer, and have a dark color (to be precise, the layers themselves are not black, but are subjected to the effects of the color of the base; in the present specification, this is simply referred to as black), and therefore, significant contrast, specifically, relative to the indicating layer which is formed on top of this, can be achieved.

In addition, an $Al_2O_3$ layer or a layer that includes $Al_2O_3$ as that described above is exposed on the surface in at least one of the above described region (A1) and the region that is on the rake face and relates to cutting, and it is particularly preferable for it to have compressive residual stress in at least a portion of this region. As a result, the portion which most relates to the chipping preventing properties can have a high level of both wear resistance and toughness. With regard to this, it is more preferable for the entirety of the above described region (A1) and the region that is on the rake face and relates to cutting to have compressive residual stress. Here, it is preferable for the compressive residual stress to be stress of which the absolute value is no less than 0.1 GPa, it is more preferable for it to be no less than 0.2 GPa, and it is most preferable for it to be no less than 0.5 GPa. Meanwhile, the greater the absolute value is, the more preferable, from the point of view of providing toughness, while, it is not preferable for the absolute value to exceed 8 GPa, because this may cause the layer itself to peel. Here, the crystal structure of the $Al_2O_3$ that constitutes the $Al_2O_3$ layer or layer that includes $Al_2O_3$ is not particularly limited, and may be $\alpha\text{-}Al_2O_3$, $\kappa\text{-}Al_2O_3$, $\gamma\text{-}Al_2O_3$ or $Al_2O_3$ in an amorphous state, or may be a structure where these are mixed. In addition, the layer that includes $Al_2O_3$ means a layer which includes at least $Al_2O_3$ as a portion of the layer (in the case where no less than 50 mass % is included, it is assumed that $Al_2O_3$ is included), and the remaining portion can be formed of other compounds that form the base layer, $ZrO_2$, $Y_2O_3$ (which can be regarded as alumina to which Zr or Y are added) or the like, and may also include chlorine, carbon, boron, nitrogen or the like.

In addition, TiCN, TiN, TiCNO, TIBN, $ZrO_2$, AlN and the like can be cited as concrete examples of the compounds that form base layer 12, which can be used instead of the $Al_2O_3$ (or together with $Al_2O_3$). In a preferable example, a TiN layer having a thickness of several μm is first formed on the entire surface of substrate 8 as base layer 12, and a TiCN layer having a thickness of several μm is formed on top of this, and furthermore, an $Al_2O_3$ layer (or a layer that includes $Al_2O_3$) having a thickness of several μm is formed on top of this, which functions as a wear-resistant layer.

In addition, a more preferable example has an aspect where a layer that is formed of a compound of Ti and one or more types of elements from among nitrogen, oxygen and boron is formed as a layer beneath the $Al_2O_3$ layer or layer that includes $Al_2O_3$. With this configuration, excellent adhesiveness can be gained, particularly between the $Al_2O_3$ layer or layer that includes $Al_2O_3$ and the layer underneath, and furthermore, it becomes possible to gain excellent wear resistance. TiN, TiBN, TiBNO, TiCNO and the like can be cited as concrete examples of this compound. In addition, compounds such as AlON and AlCNO can be cited as appropriate compounds other than the above.

As described above, a wear-resistant layer is adopted for base layer 12, and thereby, the lifetime of the coated cutting insert can be significantly prolonged. In addition, an advantage, such that the ability to bear more harsh environments of use, such as when the cutting speed is high, can be gained, and when such a layer is formed on at least the rake face or both the flank face and the rake face, this advantage can be exploited more effectively.

It is preferable for the thickness of this base layer 12 to be no smaller than 0.05 μm and no greater than 20 μm. In the case where the thickness is less than 0.05 μm, wear resistance is not high, and conversely, in the case where the thickness exceeds 20 μm, wear resistance is not improved, and this is not economically advantageous. The thickness may be no smaller than 20 μm without any problems if economic efficiency is ignored, and in this case, the effects of the present invention can be gained. In accordance with a method for measuring the thickness, for example, a coated cutting insert is cut, and the cross section thereof is observed through an SEM (scanning electron microscope).

<Indicating Layer>

The indicating layer of the present invention is characterized by being formed, as shown in, for example, FIGS. 2 and 5, on the flank face and on the base layer over an entirety or a portion of region (A2) excluding region (A1) extending from the cutting edge in a vertical direction with a distance of no less than 0.2 mm and less than 3.0 mm. As a result of research by the present inventor, it was found that a work material significantly adheres to region (A1) extending from the cutting edge in a vertical direction with a distance of no less than 0.2 mm and less than 3.0 mm. According to the present invention, excellent effects can be gained, such that the work material can be effectively prevented from adhering to the edge by selectively forming the indicating layer in the entirety or a portion of region (A2) excluding the above described region (A1), and thereby, the appearance and surface smoothness of the work material after cutting processing can be prevented from becoming poor, while providing the function of giving caution.

In the case where the distance from the cutting edge in the vertical direction is less than 0.2 mm, the work material adheres to the edge, and therefore, excellent effects as those described cannot be gained. In addition, in the case where this distance exceeds 3.0 mm, the change in color of the indicating layer resulting from cutting may not sufficiently be shown, depending on the cutting conditions. A preferable lower limit for the above described distance is no less than 0.3 mm, and a more preferable lower limit is no less than 0.5 mm, in the case where the thickness of the coated cutting insert is 2 mm to 8 mm. In addition, a preferable upper limit is less than 2.5 mm, and a more preferable upper limit is less than 2.0 mm, in the case where the thickness of the coated cutting insert is 2 mm to 8 mm. It is preferable for an appropriate distance to be selected from within this range in accordance with the size of the coated cutting insert.

As shown in, for example, FIG. 5, coating 11 has an indicating layer 13 which is formed on flank face 3 and on base layer 12 over the entirety or a portion of region (A2) excluding region (A1) extending from the above described cutting edge 4 in a vertical direction with a distance of no less than 0.2 mm and less than 3.0 mm. This indicating layer can be formed in accordance with a known chemical vapor deposition method, a physical vapor deposition method, a vacuum deposition method, a plating method or a sputtering method, and this method for forming the layer is not particularly limited.

Here, it is defined in the above as "the entirety or a portion of region (A2)" because, in the case where only one portion on the cutting edge relates to cutting, the function of giving caution is realized simply by placing the indicating layer only in a portion in proximity to the portion that relates to cutting, and it is not necessary to form an indicating layer occupying such a large area as to cover the entire surface of the above described region (A2). Accordingly, cases where such an indicating layer is formed in only a portion of the above described region (A2), in addition to on the entire surface of the above described region (A2) are also included.

In addition, the distance of no less than 0.2 mm and less than 3.0 mm is an average value. This is because it is difficult to maintain this distance constant (that is to say, to gain precisely the same numeral value for any portion of region (A1)) in the case of industrial manufacture. Here, this average value is a value that is gained by dividing the area of an arbitrary region selected from the above described region (A1) by the unit length of this region (1 mm in the direction parallel to the cutting edge).

In addition, in the border between the portion where this indicating layer is formed (the above described region (A2)) and the portion where this indicating layer is not formed (the above described region (A1), it is assumed that the indicating layer is formed in the case where the area of the indicating layer that is occupied in a unit area (100 μm×100 μm) becomes no less than 80% when the portion in the vicinity of this border is observed through an electron microscope.

In the present embodiment, indicating layer 13 is a titanium nitride layer of which the appearance is yellow or brass (gold). In contrast, base layer 12, which is the lower layer thereof, is black or of a dark color, because of $Al_2O_3$ (the uppermost layer in the base layer). Here, it is preferable for this indicating layer 13 to be a layer that is relatively easily worn in comparison with the above described base layer 12. This is because indicating layer 13 is easily removed at the time of cutting and processing so as to expose base layer 12, which is the lower layer, and thereby, it can easily indicate that this portion is used. In addition, the indicating layer that is formed in the region other than the above described region (A2) is removed, and thereby, the coated cutting insert can be easily manufactured.

As described above, indicating layer 13 has a color which is different from that of the base layer, and is formed in a certain portion, as described above, and thereby, significant color contrast results between the portion on the flank face and the rake face. This is because, as described above, base layer 12 is usually formed as a wear resistant layer on the surface of the rake surface.

In addition, indicating layer 13 is formed on flank face 3, and on base layer 12 over the entirety or a portion of region (A2) excluding region (A1) extending from the above described cutting edge 4 in a vertical direction with a distance of no less than 0.2 mm and less than 3.0 mm, and thereby, this indicating layer 13 do not adhere to the work material at the time of cutting processing, so that the appearance and surface smoothness of the work material do not become poor, and thereby, the function of giving caution can be gained without causing such problems.

Here, this indicating layer 13 is formed by one layer or at least two layers either that is composed of at least one type of metal (element) selected from the group consisting of the elements of the IVa group, the elements of the Va group, and the elements of the VIa group in the periodic table of elements, Al, Si, Cu, Pt, Au, Ag, Pd, Fe, Co and Ni, or an alloy that includes the metal, or that is formed of a compound of at least one type of element selected from the group consisting of the elements of the IVa group, the elements of the Va group, and the elements of the VIa group in the periodic table of elements, Al and Si, and at least one type of element selected from the group consisting of carbon, nitrogen, oxygen and boron. All of these layers have vivid color and can be industrially manufactured with ease, which is preferable.

In addition, it is particularly preferable that the outermost layer of this indicating layer is formed by a layer either that is composed of at least one type of metal selected from the group consisting of the elements of the IVa group, the elements of the Va group, and the elements of the VIa group in the periodic table of elements, Al, Si, Cu, Pt, Au, Ag, Pd, Fe, Co and Ni, or that is formed of a compound of at least one type of element selected from the group consisting of the elements of the IVa group, the elements of the Va group, and the elements of the VIa group in the periodic table of elements, Al and Si, and at least one type of element selected from the group consisting of carbon, nitrogen, oxygen and boron. This is because this compound has a particularly vivid color, such as yellow, pink, brass or gold, and can be made with excellent industrial design, and can create clear contrast against the base layer. Here, in the case where the indicating layer is formed of only one layer, this layer becomes the outermost layer.

More concretely, such an indicating layer can be formed of elements or a compound, such as ZrN, TiCN, TiSiCN, TiCNO, VN or Cr, in addition to TiN, which is used in the present embodiment.

In addition, indicating layer 13 does not have an effect of improving the strong wear resistance (that is to say, it is preferable for it to be a layer that is easily worn), and has a relatively thin thickness. A preferable thickness is no less than 0.05 μm and no greater than 2 μm, and a more preferable thickness is no less than 0.1 μm and no greater than 0.5 μm. In the case of less than 0.05 μm, it is industrially difficult to coat uniformly on a predetermined portion, and therefore, unevenness in color occurs in the appearance, making the appearance poor. In addition, in the case of a thickness exceeding 2 μm, there is no great difference in the function of the indicating layer, but this is economically disadvantageous. As for the method for measuring the thickness, the same method as that for measuring the base layer can be adopted.

Here, indicating layer 13 can be made to have compressive residual stress. This contributes to increasing the toughness of the coated cutting insert. It is preferable for the compressive residual stress to be stress of which the absolute value is no less than 0.1 GPa, it is more preferable for it to be no less than 0.2 GPa, and it is most preferable for it to be no less than 0.5 GPa. In the case where the absolute value is less than 0.1 GPa, sufficient toughness cannot be gained in some cases, and though the greater the absolute value is, the more preferable from the point of view of providing toughness, in the case where the absolute value exceeds 8 GPa, the indicating layer may peel, which is not preferable.

<Surface Roughness Ra of Flank Face and Rake Face>

It is particularly preferable for the above described region (A1) of the present invention to be smooth, in order to prevent the work material from adhering to the edge. Such surface smoothness can be gained by carrying out mechanical processing, for example, a brushing operation or a blasting process (sandblasting), on the surface of the above described region (A1). Such mechanical processing is usually carried out in order to remove the indicating layer that has been formed on the base layer, and it is also possible to carry out this independently as a processing operation on the surface of the above described region (A1). Here, the smoothness can be gained by means of, for example, a chemical process or a physical process, in addition to this mechanical process.

In addition, as a result of research by the present inventor, it has been found that particularly good properties of preventing the work material from adhering to the edge can be gained in the case where the relationship 1.0>A/B is gained when surface roughness Ra of the above described region (A1) is A μm and surface roughness Ra of the above described region (A2) is B μm. The relationship is more preferably 0.8>A/B, and most preferably, 0.6>A/B.

Here, the above described surface roughness Ra is a type of numeral value representing surface roughness, and is referred to as average value along the center line. The measuring method thereof is not particularly limited, and any known measuring methods can be adopted. It may be, for example, a contact method (such as a probing method), a no contact method (such as a laser microscope method) or a method for directly observing the cross section of a coated cutting insert through a microscope.

<Manufacturing Method for Coated Cutting Insert>

A manufacturing method for a coated cutting insert of the present invention is a method of manufacturing a coated cutting insert having a substrate, a base layer which is formed on the substrate, and an indicating layer which is formed on a portion of the base layer, characterized by including the steps of: forming the base layer on the substrate; forming the indicating layer of which the color is different from that of the base layer on the base layer; and removing the indicating layer that has been formed on a region on a flank face of the substrate, including at least a region (A1) extending from a cutting edge in a vertical direction with a distance of no less than 0.2 mm and less than 3.0 mm, and on a rake face. As a result, a coated cutting insert can be manufactured with extremely high production efficiency.

As described above, indicating layer 13 is once formed on base layer 12 at the time of manufacture of coated cutting insert 1, and after that, removed from region (A1) on the flank face, and extending from the cutting edge in a vertical direction with a distance of no less than 0.2 mm and less than 3.0 mm, and on the rake face. As a result, a coated cutting insert having significant color contrast between a portion of the flank face and the rake face, as described above, can be manufactured.

As the method for removing indicating layer 13 as described above, any of a chemical method, a physical method and a mechanical method can be adopted. Preferably, a physical or mechanical method, such as removal using brushing or other friction, or removal using sandblasting (blasting processing) is adopted.

Furthermore, the manufacturing method for a coated cutting insert of the present invention may include the step of carrying out a smoothening process on the above described region (A1) (including cases where this is carried out simultaneously with the step of removing the indicating layer). It is preferable for this smoothening process to be carried out so that the relationship 1.0>A/B is gained when surface roughness Ra of the above described region (A1) is A μm and surface roughness Ra of the above described region (A2) is B μm. As a result, it becomes possible to maintain a good appearance and surface smoothness of a work material after cutting processing.

As the smoothening process, any of a chemical method, a physical method and a mechanical method can be adopted. Preferably, a physical or mechanical method, such as method using brushing or other friction, including grinding using sandblasting (blasting processing) is adopted.

<Working Effects>

The above described coated cutting insert 1 has flank face 3 having no scratches in a state where it is not used, as shown in FIG. 2. Particularly, on flank face 3, the entirety or a portion of region (A2) excluding region (A1) extending from cutting edge in a vertical direction with a distance of no less than 0.2 mm and less than 3.0 mm still has the same color as original indicating layer 13, and thereby indicating this cutting edge 4 is not used. In the case where the entirety or a portion of this region (A2) is coated with TiN, for example, the portion of indicating layer 13 in this region (A2) is shiny brass (gold) in a state where it is not used. In contrast, the above described region (A1) and rake face 2 are made of $Al_2O_3$ constituting base layer 12 and have an appearance of a relatively dark color or almost black, which is a representative color for the coated cutting insert.

A case where coated cutting insert 1 is attached to the main body of a cutting tool and one cutting edge from among several cutting edges 4 forms an effective cutting edge is considered, for the purpose of the following description. When the cutting tool is used, the above described cutting edge 4 immediately makes contact with a work material 5, and starts cutting and processing of work material 5. In particular, in the section of cutting edge 4 and rake face 2, the amount of wear of coated cutting insert 1 is small because of base layer 12.

When cutting using cutting edge 4 is started, however, indicating layer 13 in the section (region (A2) excluding region (A1) on flank face 3, and extending from cutting edge in a vertical direction with a distance of no less than 0.2 mm. and less than 3.0 mm) which is adjacent to this cutting edge 4 changes in color, and there is relatively large initial change in this region (A2) on flank face 3. In the section of which the color has changed, the color is different from that of indicating layer 13, and in some cases, base layer 12, of which the color is much darker than that of indicating layer 13, can be seen.

Figure 3:
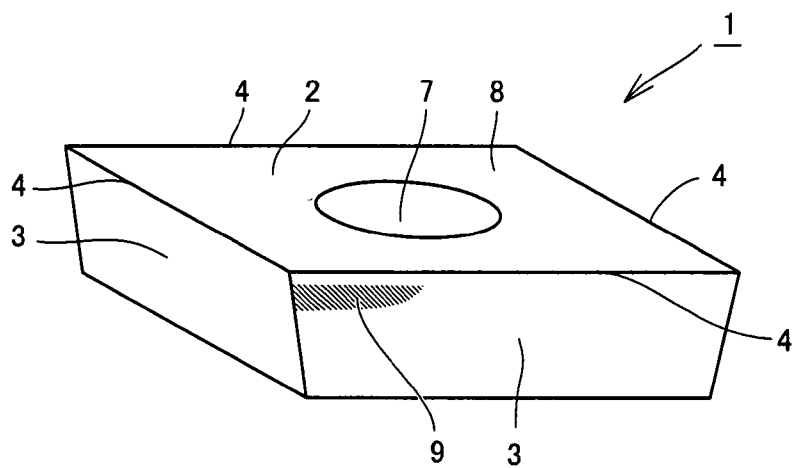
FIG. 3 is a schematic perspective diagram showing a coated cutting insert of the present invention after one cutting edge has been used.

Therefore, a changed color section 9 of which the color has become darker appears along cutting edge 4, as shown in FIG. 3. This changed color section 9 can be immediately and easily recognized, thereby showing the function of giving caution. This change in color may result from a change caused by heat, for example, an oxidation phenomenon, in addition to the change resulting from the exposure of base layer 12.

As shown in FIG. 3, for example, indicating layer 13 in the section (region (A2) excluding region (A1) on flank face 3, and extending from cutting edge in a vertical direction with a distance of no less than 0.2 mm and less than 3.0 mm) which is adjacent to this cutting edge 4 has a tempered color, and therefore, changed color section 9 appears herein. This is caused by increase in the temperature in the vicinity of the cutting edge which, in some cases, results from cutting processing of a work material using cutting edge 4.

Figure 4:
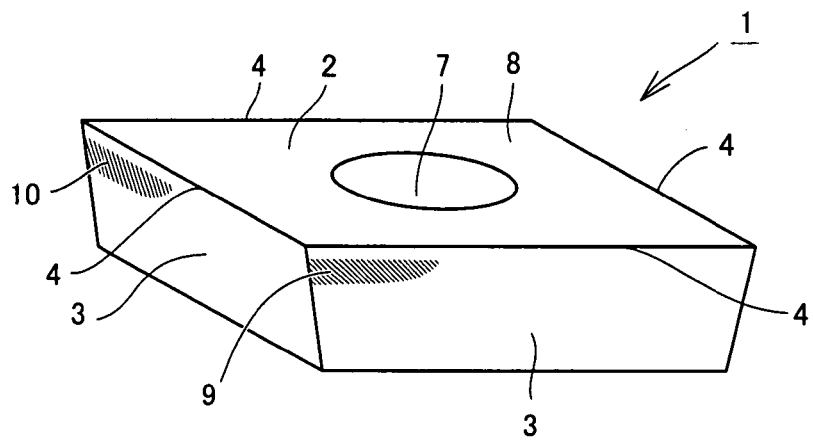
FIG. 4 is a schematic perspective diagram showing a coated cutting insert of the present invention after two cutting edges have been used.

Flank face 3 has the appearance shown in FIG. 4 after coated cutting insert 1 has been used for a long period of time (after the cutting position has been changed), and the appearance shown in FIG. 3 results soon after the initial several minutes of cutting work, and therefore, the user can confirm at a glance that, for example, one cutting edge 4 has already been used, while another cutting edges 4 have not yet been used. When another cutting edge 4 is used for the first time, it shows the appearance shown in FIG. 4. In this case, indicating layer 13 in the section (region (A2) excluding region (A1) on flank face 3, and extending from cutting edge in a vertical direction with a distance of no less than 0.2 mm and less than 3.0 mm) which is adjacent to this another cutting edge 4 changes in color, creating a changed color section 10, and thereby, it is indicated that this cutting edge 4 has been used.

Here, coated cutting inserts 1 shown in FIGS. 2 to 4 are throwaway coated cutting inserts having four usable cutting edges 4. Which cutting edge 4 from among these four cutting edges have already been used and which have not yet been used can be seen at a glance by checking the color of indicating layer 13. Accordingly, maintenance of a cutting tool with which such a coated cutting insert is equipped is particularly easily.

As described above, coated cutting insert 1 is coated with a complex coating 11 made of base layer 12 and indicating layer 13 (FIG. 5). Here, the indicating layer is formed on a certain portion of a single or a plurality of the flank faces; in general coated cutting inserts, such as those of ISO standard SNGN120408, a side thereof constitute a flank face, and in exceptional coated cutting inserts other than these, referred to as "longitudinal use" inserts, the upper surface or the bottom constitutes a flank face.

A clear mark is left on indicating layer 13 when cutting edge 4 which is adjacent to this indicating layer 13 is used even for a short period of time, and this indicating layer 13 changed in color or quality. As described above, indicating layer 13 is very sensitive, so that the layer or the material having a different color underneath can be seen. In this manner, by the function of indicating layer 13, clear color contrast or brightness contrast may be created, and the used cutting edge can be immediately and easily recognized. A certain portion on the flank face (region (A2) excluding region (A1) extending from cutting edge in a vertical direction with a distance of no less than 0.2 mm and less than 3.0 mm) is coated as described above, which may be disadvantageous in terms of friction, and therefore, the appearance and surface smoothness of the work material do not become poor, and thus, it is found that it is particularly advantageous to use this region (A2) as an indicating surface.

EXAMPLES

In the following, the present invention is described in further detail by citing examples, but the invention is not limited to these.

Example 1

A raw material powder having a composition of 87 mass % of WC, 2.5 mass % of TaC, 1.0 mass % of NbC, 2.0 mass % of TiC and 7.5 mass % of Co was pressed, and subsequently, sintered for one hour at 1400° C. in a vacuum atmosphere, and after that, flat polishing processing and edge processing were carried out, and thereby, a cemented carbide insert in the form of ISO number CNMG120408 was fabricated, and this was used as a substrate. In this substrate, at least one surface is used as a rake face, and at least another surface is used as a flank face, and at the same time, the ridge where the rake face and the flank face cross (here, this is a virtual ridge, because edge processing has been carried out) is used as a cutting edge. Here, a beta (β) removal layer is not formed on the surface of this substrate.

The following layers were formed in accordance with a known thermal CVD method in an order starting from a lower layer on the entire surface of this substrate. That is to say, 0.4 μm of TiN, 4.8 μm of TiCN (MT-CVD), 1.3 μm of α alumina (Al$_2$O$_3$) and 0.4 μm of TiN, which is the outermost layer, were sequentially coated starting from the surface side of the substrate (total film thickness: 6.9 μm). In this coating (referred to as coating No. 1), 0.4 μm of TiN (on the surface side of the substrate), 4.8 μm of TiCN and 1.3 μm of α alumina (Al$_2$O$_3$) form the base layer, and 0.4 μm of TiN, which is the outermost layer, is the indicating layer.

In the same manner, each of coatings No. 2 to 6 listed in the following Table 1 was coated on the entire surface of a substrate in place of this coating No. 1.

TABLE 1

| | Coating | | |
|---|---|---|---|
| No. | Base layer | Indicating layer | Total film thickness |
| 1 | TiN(0.4 μm)/TiCN(MT-CVD, 4.8 μm)/α-Al$_2$O$_3$(1.3 μm) | TiN(0.4 μm) | 6.9 μm |
| 2 | TiC(0.2 μm)/TiCN(MT-CVD, 2.5 μm)/κ-Al$_2$O$_3$(1.2 μm) | TiCN(0.5 μm) | 4.4 μm |
| 3 | TiN(0.4 μm)/TiCN(MT-CVD, 4.7 μm)/TiC(2.4 μm)/κ-Al$_2$O$_3$(1.7 μm) | TiN(0.5 μm) | 9.7 μm |
| 4 | TiN(0.3 μm)/ZrCN(3.2 μm)/ZrO$_2$(0.5 μm)/α-Al$_2$O$_3$(1.3 μm) | ZrN(0.4 μm) | 5.7 μm |
| 5 | TiN(0.3 μm)/TiCN(MT-CVD, 5.8 μm)/TiBN(0.9 μm)/α-Al$_2$O$_3$(5.0 μm) | TiN(0.4 μm) | 12.4 μm |
| 6 | TiN(0.4 μm)/TiCN(MT-CVD, 4.8 μm)/α-Al$_2$O$_3$(1.3 μm) | Cr(0.4 μm) | 6.9 μm |

In the above described Table 1, the coatings, starting from the left, were sequentially layered on the surface of the substrate in order to form the base layer. In addition, all of the layers, except for the Cr layer of coating No. 6, were formed in accordance with a known thermal CVD method. The Cr layer was formed in accordance with a sputtering method.

The following seven types of processing methods A to G were respectively carried out on the substrates where these coatings were coated in accordance with a known blasting method. Here, in each of the processing methods, portions where it was desired to leave the indicating layer were masked using a jig.

(Processing Method A)

No processing in accordance with a blasting method was carried out on the coating. Accordingly, the surface of the substrate showed the color of the indicating layer (gold, which is the color of TiN in the case of, for example, coating No. 1) on the entire surface.

(Processing Method B)

Figure 6:
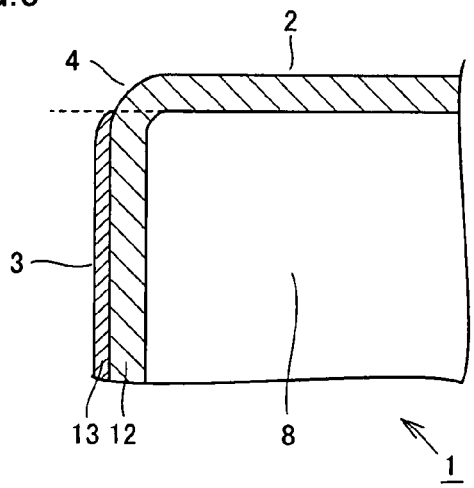
FIG. 6 is a cross sectional diagram showing a coated cutting insert where an indicating layer has been formed on an entire surface of the flank face.

The indicating layer on the rake face was removed from the coating in accordance with a blasting method. Accordingly, the entire surface of the flank face, including the cutting edge, showed the color of the indicating layer (gold, which is the color of TiN in the case of, for example, coating No. 1), and the rake face showed the color of the base layer (black, which is the color of Al$_2$O$_3$ in the case of, for example, coating No. 1) (see FIG. 6; here, though in FIG. 6, indicating layer 3 stops before the rake face without extending over the rake face, cases where the indicating layer is formed so as to extend over the rake face are also included in the aspect of the present processing method).

(Processing Method C)

Figure 7:
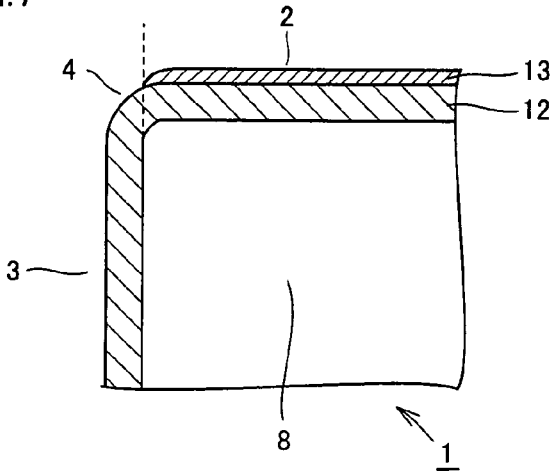
FIG. 7 is a cross sectional diagram showing a coated cutting insert where an indicating layer has been formed on an entire surface of the rake face.

The indicating layer on the entire surface of the flank face, including the cutting edge, was removed from the coating in accordance with a blasting method. Accordingly, the rake face showed the color of the indicating layer (gold, which is the color of TiN in the case of, for example, coating No. 1), and the entire surface of the flank face, including the cutting edge, showed the color of the base layer (black, which is the color of Al$_2$O$_3$ in the case of, for example, coating No. 1) (see FIG. 7; here, though in FIG. 7, indicating layer 3 stops before the flank face without extending over the flank face, cases where the indicating layer is formed so as to extend over the flank face are also included in the aspect of the present processing method).

(Processing Method D)

The indicating layer in region (A1) on the flank face, extending from the cutting edge in a vertical direction with a distance of 0.5 mm to 0.8 mm, and on the entire surface of the rake face was removed from the coating in accordance with a blasting method. Accordingly, on the flank face, region (A2) excluding region (A1) extending from the cutting edge in a vertical direction with a distance of 0.5 mm to 0.8 mm showed the color of the indicating layer (gold, which is the color of TiN in the case of, for example, coating No. 1), and region (A1) on the flank face, extending from the cutting edge in a vertical direction with a distance of 0.5 mm to 0.8 mm, and the rake face (including the cutting edge) showed the color of the base layer (black, which is the color of $Al_2O_3$ in the case of, for example, coating No. 1) (FIG. 5). Here, the distance 0.5 mm to 0.8 mm is an average value, and this average value has such a range because it is difficult to maintain the distance constant due to the spread of blasting, and error could not be avoided, though masking was carried out as precisely as possible.

(Processing Method E)

The indicating layer in region (A1) on the flank face, extending from the cutting edge in a vertical direction with a distance of 0.2 mm to 0.5 mm, and on the entire surface of the rake face was removed from the coating in accordance with a blasting method. Accordingly, on the flank face, region (A2) excluding region (A1) extending from the cutting edge in a vertical direction with a distance of 0.2 mm to 0.5 mm showed the color of the indicating layer (gold, which is the color of TiN in the case of, for example, coating No. 1), and region (A1) on the flank face, extending from the cutting edge in a vertical direction with a distance of 0.2 mm to 0.5 mm, and the rake face (including the cutting edge) showed the color of the base layer (black, which is the color of $Al_2O_3$ in the case of, for example, coating No. 1). Here, the distance has a range of 0.2 mm to 0.5 mm for the same reason as in the above described Processing Method D.

(Processing Method F)

The indicating layer in region (A1) on the flank face, extending from the cutting edge in a vertical direction with a distance of 0.4 mm to 2.8 mm, and on the entire surface of the rake face was removed from the coating in accordance with a blasting method. Accordingly, on the flank face, region (A2) excluding region (A1) extending from the cutting edge in a vertical direction with a distance of 0.4 mm to 2.8 mm showed the color of the indicating layer (gold, which is the color of TiN. in the case of, for example, coating No. 1), and region (A1) on the flank face, extending from the cutting edge in a vertical direction with a distance of 0.4 mm to 2.8 mm, and the rake face (including the cutting edge) showed the color of the base layer (black, which is the color of $Al_2O_3$ in the case of, for example, coating No. 1). Here, the above described distance has a range of 0.4 mm to 2.8 mm for the same reason as in the above described Processing Method D.

(Processing Method G)

The indicating layer on the entire surface of the substrate was removed from the coating in accordance with a blasting method. Accordingly, the entire surface (both surfaces; the rake face and the flank face) showed the color of the base layer (black, which is the color of $Al_2O_3$ in the case of, for example, coating No. 1).

As described above, forty-two types of coated cutting inserts No. 1 to No. 42, listed in the following Tables 2 and 3, were manufactured. No. 4, 5, 6, 11, 12, 13, 18, 19, 20, 25, 26, 27, 32, 33, 34, 39, 40 and 41 are examples of the present invention, and the rest are comparative examples.

After that, a turning cutting test was performed on these coated cutting inserts No. 1 to 42 under the below described conditions, and thereby, the surface roughness of the work material and the amount of wear on the flank face of the coated cutting insert were measured. The results are shown in the following Tables 2 and 3. The smaller the numerical value of the surface roughness (Rz) of the work material is, the better the exhibited smoothness is, and the smaller the numerical value of the amount of wear on the flank face is, the better the exhibited wear resistance is.

(Conditions for Turning Cutting Test)
Work material: SCM415
Cutting speed: 110 m/min
Feed: 0.14 mm/rev.
Depth of cut: 1.0 mm
Cutting. lubricant: none
Cutting time: 40 minutes

TABLE 2

| | Coated cutting insert No. | Coating No. | Processing method | Amount of wear on flank face (mm) | Surface roughness Rz of work material (µm) | State of adhesion of work material to edge | State of processed surface of work material | Recognition of used state of edge |
|---|---|---|---|---|---|---|---|---|
| | 1 | 1 | A | 0.121 | 5.6 | Great | Whitish | Easy |
| | 2 | 1 | B | 0.122 | 5.2 | Great | Whitish | Easy |
| | 3 | 1 | C | 0.116 | 2.9 | (Note 1) | (Note 2) | Easy |
| * | 4 | 1 | D | 0.112 | 2.2 | None | Close to mirror face | Easy |
| * | 5 | 1 | E | 0.113 | 2.5 | None | Close to mirror face | Easy |
| * | 6 | 1 | F | 0.112 | 2.1 | None | Close to mirror face | Easy |
| | 7 | 1 | G | 0.114 | 2.2 | None | Close to mirror face | Difficult |
| | 8 | 2 | A | 0.153 | 5.4 | Great | Whitish | Easy |
| | 9 | 2 | B | 0.150 | 4.8 | Great | Whitish | Easy |
| | 10 | 2 | C | 0.140 | 3.0 | (Note 1) | (Note 2) | Easy |
| * | 11 | 2 | D | 0.137 | 2.5 | None | Close to mirror face | Easy |
| * | 12 | 2 | E | 0.136 | 2.8 | None | Close to mirror face | Easy |
| * | 13 | 2 | F | 0.136 | 2.7 | None | Close to mirror face | Easy |
| | 14 | 2 | G | 0.137 | 2.6 | None | Close to mirror face | Difficult |
| | 15 | 3 | A | 0.124 | 5.9 | Great | Whitish | Easy |
| | 16 | 3 | B | 0.113 | 5.0 | Great | Whitish | Easy |

TABLE 2-continued

|   | Coated cutting insert No. | Coating No. | Processing method | Amount of wear on flank face (mm) | Surface roughness Rz of work material (μm) | State of adhesion of work material to edge | State of processed surface of work material | Recognition of used state of edge |
|---|---|---|---|---|---|---|---|---|
|   | 17 | 3 | C | 0.099 | 3.2 | (Note 1) | (Note 2) | Easy |
| * | 18 | 3 | D | 0.094 | 2.9 | None | Close to mirror face | Easy |
| * | 19 | 3 | E | 0.093 | 2.8 | None | Close to mirror face | Easy |
| * | 20 | 3 | F | 0.093 | 2.7 | None | Close to mirror face | Easy |
|   | 21 | 3 | G | 0.094 | 2.6 | None | Close to mirror face | Difficult |

(Note 1) some adhesion to rake face
(Note 2) somewhat close to mirror face

TABLE 3

|   | Coated cutting insert No. | Coating No. | Processing method | Amount of wear on flank face (mm) | Surface roughness Rz of work material (μm) | State of adhesion of work material to edge | State of processed surface of work material | Recognition of used state of edge |
|---|---|---|---|---|---|---|---|---|
|   | 22 | 4 | A | 0.124 | 5.5 | Great | Whitish | Easy |
|   | 23 | 4 | B | 0.111 | 5.2 | Great | Whitish | Easy |
|   | 24 | 4 | C | 0.093 | 2.9 | (Note 1) | (Note 2) | Easy |
| * | 25 | 4 | D | 0.083 | 2.4 | None | Close to mirror face | Easy |
| * | 26 | 4 | E | 0.079 | 2.4 | None | Close to mirror face | Easy |
| * | 27 | 4 | F | 0.080 | 2.3 | None | Close to mirror face | Easy |
|   | 28 | 4 | G | 0.080 | 2.4 | None | Close to mirror face | Difficult |
|   | 29 | 5 | A | 0.103 | 5.5 | Great | Whitish | Easy |
|   | 30 | 5 | B | 0.095 | 4.9 | Great | Whitish | Easy |
|   | 31 | 5 | C | 0.061 | 2.5 | (Note 1) | (Note 2) | Easy |
| * | 32 | 5 | D | 0.054 | 2.0 | None | Close to mirror face | Easy |
| * | 33 | 5 | E | 0.053 | 2.1 | None | Close to mirror face | Easy |
| * | 34 | 5 | F | 0.055 | 2.0 | None | Close to mirror face | Easy |
|   | 35 | 5 | G | 0.054 | 2.0 | None | Close to mirror face | Difficult |
|   | 36 | 6 | A | 0.124 | 5.8 | Great | Whitish | Easy |
|   | 37 | 6 | B | 0.121 | 5.4 | Great | Whitish | Easy |
|   | 38 | 6 | C | 0.117 | 2.6 | (Note 1) | (Note 2) | Easy |
| * | 39 | 6 | D | 0.111 | 2.1 | None | Close to mirror face | Easy |
| * | 40 | 6 | E | 0.112 | 2.3 | None | Close to mirror face | Easy |
| * | 41 | 6 | F | 0.113 | 2.2 | None | Close to mirror face | Easy |
|   | 42 | 6 | G | 0.112 | 2.1 | None | Close to mirror face | Difficult |

(Note 1) some adhesion to rake face
(Note 2) somewhat close to mirror face

In Tables 2 and 3, items having an asterisk are examples of the present invention. Here, the outermost layer of the base layer is black in all cases irrespectively of the type of coating, and as for the indicating layer, TiN and ZrN are gold, TiCN is pink, and Cr is silver.

As is clear from Tables 2 and 3, coated cutting inserts No. 4, 5, 6, 11, 12, 13, 18, 19, 20, 25, 26, 27, 32, 33, 34, 39, 40 and 41, which are the examples of the present invention, are excellent in the function of giving caution, so that recognition of the state of use of the cutting edge is easy, have an edge to which the work material does not adhere, and are excellent in terms of the surface roughness of the work material, so that the state of the work material after cutting is close to a mirror face. Here, in the case where the surface roughness Ra of the above described region (A1) is A μm and the surface roughness Ra of the above described region (A2) is B μm, in all of the coated cutting inserts of these examples of the present invention, a relation of 0.8>A/B is established (the measuring method is the same as that for the below described No. 4).

In contrast, with coated cutting inserts No. 1, 2, 8, 9, 15, 16, 22, 23, 29, 30, 36 and 37, although it was possible to recognize the state of use of the cutting edge, a large amount of work material adhered to the edge, the work material after cutting was whitish, and the surface roughness of the work material was poor. In addition, though the amount of adhesion of the work material to the coated cutting inserts No. 3, 10, 17, 24, 31 and 38 is considerably low in comparison with that with the coated cutting insert No. 1, 2, 8, 9, 15, 16, 22, 23, 29, 30, 36 and 37, there was some amount of adhesion to the rake face. As for the coated cutting inserts No. 7, 14, 21, 28, 35 and 42, though the state of the work material after cutting was good, it was difficult to recognize the state of use of the cutting edge, and there was no function of giving caution.

As a result, it is clear that the coated cutting inserts that are the examples of the present invention have excellent effects, in comparison with the coated cutting inserts of the respective comparative examples. Here, though the present examples show the cases of coated cutting inserts where no chip breaker is formed, the present invention is also effective for coated cutting inserts where a chip breaker is formed.

Meanwhile, processing was carried out on the above described region (A1) in accordance with a blasting method where the degree of blasting was changed in the same manufacturing method as that for coated cutting insert No. 4 that was manufactured in the above, and thereby, coated cutting inserts No. 4-2, 4-3 and 4-4, according to the present invention, having a region (A1) having the surface roughness Ra and a region (A2) having the surface roughness Ra in Table 4 were manufactured. Here, surface roughness Ra was measured using a laser microscope. The measured portion of the above described region (A1) is a point of which the distance from the cutting edge is ½ of the width region (A1) (that is to say, the center portion of region (A1)), and the measured portion of the above described region (A2) is a point of which the distance from the cutting edge is ½ of the width of the flank face (that is to say, the center portion of region (A2)), and the measured distance was 100 μm.

In addition, a turning cutting test was performed on these coated cutting inserts No. 4, 4-2, 4-3 and 4-4 under the same conditions as those described above, and surface roughness Rz of the work material was measured in the same manner as described above. The results are shown in Table 4.

TABLE 4

| Coated cutting insert No. | Surface roughness Ra | | | Surface roughness (Rz) of work material |
|---|---|---|---|---|
| | Region (A1) A μm | Region (A2) B μm | A/B | |
| 4 | 0.19 | 0.31 | 0.61 | 2.2 |
| 4-2 | 0.31 | 0.32 | 0.99 | 2.5 |
| 4-3 | 0.26 | 0.31 | 0.84 | 2.0 |
| 4-4 | 0.08 | 0.28 | 0.29 | 1.7 |

As is clear from Table 4, in the case where surface roughness Ra of the above described region (A1) is A μm and surface roughness Ra of the above described region (A2) is B μm, the smaller the value of A/B is, the better surface roughness Rz of the work material becomes.

From these results, in order to prevent the work material from adhering to the coated cutting insert and the appearance of the work material from becoming poor, in the case where surface roughness Ra of the above described region (A1) is A μm and surface roughness Ra of the above described region (A2) is B μm, it is effective to make 1.0>A/B, and it is more effective to make this value of A/B as small as 0.8>A/B, or even smaller, at 0.6>A/B.

Example 2

A substrate was gained in the same manner as in Example 1, except that the substrate of the coated cutting insert is formed so as to be ISO number SPGN120408.

The following layers were formed in accordance with a known thermal CVD method in an order starting from a lower layer on the entire surface of this substrate. That is to say, 0.4 μm of TiN, 2.9 μm of TiCN (MT-CVD), 1.2 μm of α alumina ($Al_2O_3$) and 0.5 μm of TiN, which is the outermost layer, were sequentially coated starting from the surface side of the substrate (total film thickness: 5.0 μm). In this coating (referred to as coating No. 7), 0.4 μm of TiN (on the surface side of the substrate), 2.9 μm of TiCN and 1.2 μm of α alumina ($Al_2O_3$) form the base layer (black), and 0.5 μm of TiN, which is the outermost layer, is the indicating layer (gold).

In the same manner, each of coatings No. 8 to 12 listed in the following Table 5 was coated on the entire surface of a substrate in place of this coating No. 7.

TABLE 5

| | | Coating | | |
|---|---|---|---|---|
| No. | Base layer | | Indicating layer | Total film thickness |
| 7 | TiN(0.4 μm)/TiCN(MT-CVD, 2.9 μm)/α-$Al_2O_3$(1.2 μm) | | TiN(0.5 μm) | 5.0 μm |
| 8 | TiN(0.3 μm)/TiCN(MT-CVD, 3.5 μm)/TiBN(0.8 μm)/κ-$Al_2O_3$(1.2 μm) | | TiN(0.4 μm) | 6.2 μm |
| 9 | TiN(0.3 μm)/TiCN(MT-CVD, 4.9 μm)/$ZrO_2$(1.0 μm) | | TiN(0.4 μm) | 6.6 μm |
| 10 | TiAlN(2.5 μm)/α-$Al_2O_3$(1.3 μm) | | TiN(0.4 μm) | 4.2 μm |
| 11 | CrAlN(3.1 μm)/κ-$Al_2O_3$(1.1 μm) | | TiCN(0.3 μm) | 4.5 μm |
| 12 | TiN(0.3 μm)/TiAlN(3.8 μm) | | TiCN(0.5 μm) | 4.6 μm |

In the above described Table 5, coatings, starting from the left, were sequentially layered on the surface of the substrate in order to form the base layer. In addition, all of the layers of coatings No. 8 and 9 were formed in accordance with a known thermal CVD method, in the same manner as coating No. 7. Coatings No. 10 to 12 were formed in accordance with a known PVD method.

In addition, processing methods A to G, which are the same as in Example 1, were respectively carried out on each of the substrates, which were coated with these coatings, and thereby, forty-two types of coated cutting inserts No. 43 to 84 listed in the following Tables 6 and 7 were manufactured. No. 46, 47, 48, 53, 54, 55, 60, 61, 62, 67, 68, 69, 74, 75, 76, 81, 82 and 83 are examples of the present invention, and the rest are comparative examples.

After that, a milling cutting test was carried out on these coated cutting inserts No. 43 to 84 under the following conditions, and the surface roughness of the work material and the amount of wear on the flank face of the coated cutting insert were measured. The results are shown in the following Tables 6 and 7. The smaller the numerical value of surface roughness (Rz) of the work material is, the better the exhibited smoothness is, and the smaller the numerical value of the amount of wear on the flank face is, the better the exhibited wear resistance is. Here, this milling cutting test was performed using DPG4160R (made by Sumitomo Electric Hardmetal Corporation) as a cutter, and only one coated cutting insert was attached to this cutter. Therefore, the feed per revolution of the cutter coincides with the feed per tooth.

(Conditions for Milling Cutting Test)
 Work material: FC250
 Cutting Speed: 160 m/min
 Feed: 0.28 mm/rev.
 Depth of cut: 1.0 mm
 Cutting lubricant: none
 Cutting distance: 12 m

TABLE 6

| | Coated cutting insert No. | Coating No. | Processing method | Amount of wear on flank face (mm) | Surface roughness Rz of work material (μm) | State of adhesion of work material to edge | State of processed surface of work material | Recognition of used state of edge |
|---|---|---|---|---|---|---|---|---|
| | 43 | 7 | A | 0.103 | 9.6 | Great | Whitish | Easy |
| | 44 | 7 | B | 0.095 | 9.0 | Great | Whitish | Easy |
| | 45 | 7 | C | 0.079 | 6.1 | (Note 1) | (Note 2) | Easy |
| * | 46 | 7 | D | 0.071 | 5.8 | None | Close to mirror face | Easy |
| * | 47 | 7 | E | 0.072 | 5.6 | None | Close to mirror face | Easy |
| * | 48 | 7 | F | 0.070 | 5.4 | None | Close to mirror face | Easy |
| | 49 | 7 | G | 0.072 | 5.4 | None | Close to mirror face | Difficult |
| | 50 | 8 | A | 0.145 | 9.4 | Great | Whitish | Easy |
| | 51 | 8 | B | 0.141 | 8.5 | Great | Whitish | Easy |
| | 52 | 8 | C | 0.101 | 5.9 | (Note 1) | (Note 2) | Easy |
| * | 53 | 8 | D | 0.093 | 5.5 | None | Close to mirror face | Easy |
| * | 54 | 8 | E | 0.092 | 5.4 | None | Close to mirror face | Easy |
| * | 55 | 8 | F | 0.094 | 5.1 | None | Close to mirror face | Easy |
| | 56 | 8 | G | 0.093 | 5.0 | None | Close to mirror face | Difficult |
| | 57 | 9 | A | 0.114 | 9.7 | Great | Whitish | Easy |
| | 58 | 9 | B | 0.110 | 9.2 | Great | Whitish | Easy |
| | 59 | 9 | C | 0.081 | 6.6 | (Note 1) | (Note 2) | Easy |
| * | 60 | 9 | D | 0.075 | 6.1 | None | Close to mirror face | Easy |
| * | 61 | 9 | E | 0.075 | 6.0 | None | Close to mirror face | Easy |
| * | 62 | 9 | F | 0.074 | 5.7 | None | Close to mirror face | Easy |
| | 63 | 9 | G | 0.074 | 5.8 | None | Close to mirror face | Difficult |

(Note 1) some adhesion to rake face
(Note 2) somewhat close to mirror face

TABLE 7

| | Coated cutting insert No. | Coating No. | Processing method | Amount of wear on flank face (mm) | Surface roughness Rz of work material (μm) | State of adhesion of work material to edge | State of processed surface of work material | Recognition of used state of edge |
|---|---|---|---|---|---|---|---|---|
| | 64 | 10 | A | 0.087 | 7.0 | Great | Whitish | Easy |
| | 65 | 10 | B | 0.081 | 6.7 | Great | Whitish | Easy |
| | 66 | 10 | C | 0.059 | 3.7 | (Note 1) | (Note 2) | Easy |
| * | 67 | 10 | D | 0.051 | 3.1 | None | Close to mirror face | Easy |
| * | 68 | 10 | E | 0.051 | 3.0 | None | Close to mirror face | Easy |
| * | 69 | 10 | F | 0.050 | 2.8 | None | Close to mirror face | Easy |
| | 70 | 10 | G | 0.049 | 2.8 | None | Close to mirror face | Difficult |
| | 71 | 11 | A | 0.091 | 7.3 | Great | Whitish | Easy |
| | 72 | 11 | B | 0.086 | 6.9 | Great | Whitish | Easy |
| | 73 | 11 | C | 0.064 | 3.9 | (Note 1) | (Note 2) | Easy |
| * | 74 | 11 | D | 0.058 | 3.4 | None | Close to mirror face | Easy |
| * | 75 | 11 | E | 0.058 | 3.4 | None | Close to mirror face | Easy |
| * | 76 | 11 | F | 0.057 | 3.1 | None | Close to mirror face | Easy |
| | 77 | 11 | G | 0.058 | 3.1 | None | Close to mirror face | Difficult |
| | 78 | 12 | A | 0.093 | 8.5 | Great | Whitish | Easy |
| | 79 | 12 | B | 0.090 | 8.2 | Great | Whitish | Easy |
| | 80 | 12 | C | 0.075 | 4.5 | (Note 1) | (Note 2) | Easy |
| * | 81 | 12 | D | 0.064 | 4.0 | None | Close to mirror face | Easy |
| * | 82 | 12 | E | 0.063 | 4.1 | None | Close to mirror face | Easy |
| * | 83 | 12 | F | 0.064 | 3.8 | None | Close to mirror face | Easy |
| | 84 | 12 | G | 0.063 | 3.9 | None | Close to mirror face | Difficult |

(Note 1) some adhesion to rake face
(Note 2) somewhat close to mirror face

In Tables 6 and 7, items having an asterisk are examples of the present invention. Here, the outermost layer of the base layer is black in all cases, irrespectively of the type of coating, and as for the indicating layer, TiN is gold and TiCN is pink.

As is clear from Tables 6 and 7, coated cutting inserts No. 46, 47, 48, 53, 54, 55, 60, 61, 62, 67, 68, 69, 74, 75, 76, 81, 82 and 83, which are the examples of the present invention, are excellent in the function of giving caution, so that recognition of the state of use of the cutting edge is easy, have an edge to which the work material do not adhere, and are excellent in terms of the surface roughness of the work material, so that the state of the work material after cutting is close to a mirror face. Here, in the case where the surface roughness Ra of the above described region (A1) is A μm and the surface roughness Ra of the above described region (A2) is B μm, in all of the coated cutting inserts of these examples of the present invention, a relation of 0.8>A/B is established (the measuring method is the same as that in Example 1).

In contrast, though with coated cutting inserts No. 43, 44, 50, 51, 57, 58, 64, 65, 71, 72, 78 and 79, it was possible to recognize the state of use of the cutting edge, a large amount of the work material adhered to the edge, the work material after cutting was whitish, and the surface roughness of the work material was poor. In addition, though the amount of adhesion of the work material to the coated cutting inserts No. 45, 52, 59, 66, 73 and 80 is considerably low in comparison with that with the above described coated cutting insert No. 43, 44, 50, 51, 57, 58, 64, 65, 71, 72, 78 and 79, there was some amount of adhesion to the rake face. As for the coated cutting inserts No. 49, 56, 63, 70, 77 and 84, though the state of the work material after cutting was good, it was difficult to recognize the state of use of the cutting edge, and there was no function of giving caution.

As a result, it is clear that the coated cutting inserts that are the examples of the present invention have excellent effects, in comparison with the coated cutting inserts of the respective comparative examples.

Example 3

A raw material powder having a composition of 89.5 mass % of WC, 2.0 mass % of TiC, 1.5 mass % of TaC and 7.0 mass % of Co was pressed and subsequently sintered for one hour at 1400° C. in a vacuum atmosphere, and after that, flat polishing processing was carried out, and edge processing was carried out on the cutting edge with an SiC brush (honing to width of 0.05 mm when viewed from the rake surface side was carried out), and thereby, a cemented carbide insert having the same form as a cutting insert CNMG120408N-UX (made by Sumitomo Electric Hardmetal Corporation) was fabricated, and this was used as a substrate. In this substrate, 13 μm of beta (β) removal layer was formed on the surface, two surfaces were used as rake faces, and four surfaces were used as flank faces, and at the same time, the rake faces and the flank faces were connected with the cutting edges (virtual ridges, because edge processing has been carried out, as described above) in between. There were eight cutting edges in total.

The following layers were formed in accordance with a known thermal CVD method in an order starting from a lower layer on the entire surface of this substrate. That is to say, 0.3 μm of TiN, 4.0 μm of TiCN (formed with MT-CVD), 2.4 μm of α alumina (α-Al$_2$O$_3$) and 0.3 μm of TiN, which is the outermost layer, were sequentially coated starting from the surface side of the substrate. In this coating (referred to as coating No. 13), 0.3 μm of TiN (on the surface side of the substrate), 4.0 μm of TiCN and 2.4 μm of α alumina (α-Al$_2$O$_3$) form the base layer, and 0.3 μm of TiN, which is the outermost layer, is the indicating layer.

In the same manner, each of coatings No. 14 to 17 listed in the following Table 8 was coated on the entire surface of a substrate in place of this coating No. 13.

were formed in accordance with an HT-CVD method (temperature for film formation: 1000° C.)).

After that, each of the following six types of processing methods H to M was carried out on these substrates coated with a coating in accordance with a known blasting method (particles of an abrasive material: alumina sand No. 120 (average particle diameter: 100 μm), pressure: 0.3 MPa). Here, in each processing method, the portion where it is desired to leave the indicating layer was masked with a jig.

(Processing Method H)

No processing in accordance with a blasting method was carried out on the coating. Accordingly, the entire surface of the substrate showed the color of the indicating layer (gold, which is the color of TiN in the case of, for example, coating No. 13).

(Processing Method I)

The indicating layer on the rake face which includes the cutting edge was removed from the coating in accordance with a blasting method. Accordingly, the entire surface of the flank face, including the cutting edge, showed the color of the indicating layer (gold, which is the color of TiN in the case of, for example, coating No. 13), and the rake face showed the color of the base layer (black, which is the color of Al$_2$O$_3$ in the case of, for example, coating No. 13) (see FIG. 6; here, though in FIG. 6, indicating layer 13 stops before rake face 2 without extending over rake face 2, cases where the indicating layer is formed so as to extend over rake face 2 are also included in the aspect of the present processing method).

(Processing Method J)

The indicating layer on the entire surface of the flank face which includes the cutting edge was removed from the coating in accordance with a blasting method. Accordingly, the rake face showed the color of the indicating layer (gold, which is the color of TiN in the case of, for example, coating No. 13), and the entire surface of the flank face, including the cutting edge, showed the color of the base layer (black, which is the color of Al$_2$O$_3$ in the case of, for example, coating No. 13) (see FIG. 7; here, though in FIG. 7, indicating layer 13 stops before flank face 3 without extending over flank face 3, cases where the indicating layer is formed so as to extend over flank face 3 are also included in the aspect of the present processing method).

TABLE 8

| | Coating | |
|---|---|---|
| No. | Base layer | Indicating layer |
| 13 | TiN(0.3 μm)/TiCN(MT-CVD, 4.0 μm)/α-Al$_2$O$_3$(2.4 μm) | TiN(0.3 μm) |
| 14 | TiC(0.4 μm)/TiCN(MT-CVD, 2.6 μm)/TiN(0.5 μm)/κ-Al$_2$O$_3$(2.0 μm) | TiCN(0.4 μm) |
| 15 | TiN(0.4 μm)/TiCN(MT-CVD, 4.5 μm)/TiC(2.2 μm)/κ-Al$_2$O$_3$(1.8 μm) | TiN(0.5 μm) |
| 16 | TiN(0.5 μm)/TiCN(MT-CVD, 2.9 μm)/TiCN(HT-CVD, 1.2 μm)/ TiBN(0.4 μm)/α-Al$_2$O$_3$(3.4 μm) | TiN(0.4 μm) |
| 17 | TiN(0.5 μm)/TiCN(MT-CVD, 4.7 μm)/TiCNO(0.3 μm)/α-Al$_2$O$_3$(1.8 μm) | TiN(0.6 μm) |

In the above described Table 8, the coatings, starting from the left, were sequentially layered on the surface of the substrate in order to form the base layer. In addition, all of the layers were formed in accordance with a known thermal CVD method (layers having the symbol MT-CVD were formed in accordance with an MT-CVD method (temperature for film formation: 900° C.), and layers having the symbol HT-CVD (Processing Method K)

Figure 8:
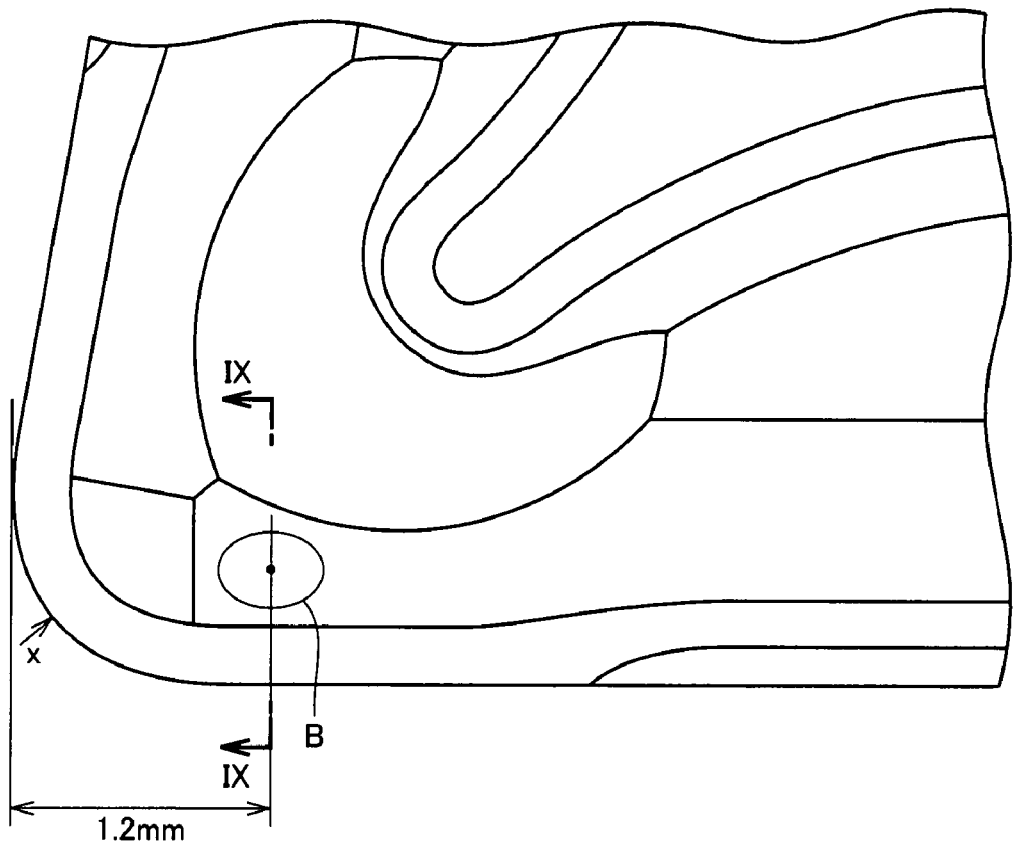
FIG. 8 is a schematic plan diagram showing one corner portion of an acute angle of a coated cutting insert.

The indicating layer on region (A1) on the flank face, extending from the cutting edge with a distance of 0.4 mm to 0.9 mm, and on the rake face was removed from the coating in accordance with a blasting method. Accordingly, on the flank face, region (A2) excluding region (A1) extending from the cutting edge with a distance of 0.4 mm to 0.9 mm showed the color of the indicating layer (gold, which is the color of TiN in the case of, for example, coating No. 13), and region (A1) on the flank face, extending from the cutting edge with a distance of 0.4 mm to 0.9 mm, and the rake face showed the color of the base layer (black, which is the color of Al$_2$O$_3$ in the case of, for example, coating No. 13) (see FIG. 5). Here, the above described distance 0.4 mm to 0.9 mm is an average value, and this average value has such a range because it is difficult to maintain the distance constant due to the spread of blasting, and error could not be avoided, though masking was carried out as precisely as possible. With respect to this, FIG. 8 is a schematic plan diagram showing one corner portion having an acute angle of a coated cutting insert of the present example, and the distance of the above described region (A1) in the portion extending in the direction perpendicular to the paper to the rear side (that is to say, the center portion on the flank face side which divides the corner portion having an acute angle into half, hereinafter referred to as portion R/2), shown by arrow x in this FIG. 8, is 0.6 mm. Here, each corner has a portion R/2, and the distance of region (A1) at portion R/2 is not completely identical in each of these portions, and the above described numeral value is that of one portion R/2 from among these (numeral value means the same in the following Processing Methods L, Q and R).

(Processing Method L)

The indicating layer on region (A1) on the flank face, extending from the cutting edge with a distance of 0.3 mm to 1.0 mm, and on the rake face was removed from the coating in accordance with a blasting method. Accordingly, on the flank face, region (A2) excluding region (A1) extending from the cutting edge with a distance of 0.3 mm to 1.0 mm showed the color of the indicating layer (gold, which is the color of TiN in the case of, for example, coating No. 13), and region (A1) on the flank face, extending from the cutting edge with a distance of 0.3 mm to 1.0 mm, and the rake face showed the color of the base layer (black, which is the color of Al$_2$O$_3$ in the case of, for example, coating No. 13) (see FIG. 5). Here, the above described distance 0.3 mm to 1.0 mm is an average value, and this average value is in this range for the same reason as in the above described processing method K. With respect to this, the distance of region (A1) in portion R/2 is 0.5 mm.

(Processing Method M)

The indicating layer on the entire surface of the substrate was removed from the coating in accordance with a blasting method. Accordingly, the entire surface of the substrate (both surfaces; rake faces and flank faces) showed the color of the base layer (black, which is the color of Al$_2$O$_3$ in the case of, for example, coating No. 13).

As described above, thirty types of coated cutting inserts No. 101 to No. 130 listed in the following Tables 9 and 10 were manufactured. No. 104, 105, 110, 111, 116, 117, 122, 123, 128 and 129 are examples of the present invention, and the rest are comparative examples.

After that, a sequential turning cutting test was performed on these coated cutting inserts No. 101 to 130 under the following conditions, and the surface roughness of the work material and the amount of wear on the flank face of the coated cutting insert were measured. In addition, the state of adhesion of the work material to the edge after cutting for one minute (the state after one minute passed after the start of cutting was observed in the present example, while the state after the completion of the cutting test was observed and measured in Examples 1 and 2), the state of the processed surface of the work material and recognizability of the state of use of the cutting edges were respectively observed. The results are shown in the following Tables 9 and 10. Here, the smaller the numerical value of the surface roughness (Rz; JIS B0601: 2001) of the work material is, the better the exhibited smoothness is, and the smaller the numerical value of the amount of wear on the flank surface is, the better the exhibited wear resistance is. In addition, the greater the amount of the work material which adhered to the edge is, the poorer the exhibited surface roughness of the work material is, while the closer to a mirror face the state of the processed surface of the work material is, the better the state is.

(Conditions for Sequential Turning Cutting Test)
  Work material: round rod of SCM435
  Cutting speed: 200 m/min
  Feed: 0.21 mm/rev.
  Depth of cut: 2.0 mm
  Cutting lubricant: used (water-soluble lubricant)
  Cutting time: 20 minutes

TABLE 9

| | Coated cutting insert No. | Coating No. | Processing method | Residual stress (GPa) | Amount of wear on flank face (mm) | Surface roughness Rz of work material (μm) | State of adhesion of work material to edge | State of processed surface of work material | Recognition of used state of edge |
|---|---|---|---|---|---|---|---|---|---|
| | 101 | 13 | H | 0.2 | 0.161 | 5.3 | Great | Whitish | Easy |
| | 102 | 13 | I | −0.2 | 0.159 | 5.4 | Great | Whitish | Easy |
| | 103 | 13 | J | 0.3 | 0.130 | 3.1 | (Note 1) | (Note 2) | Easy |
| * | 104 | 13 | K | −0.3 | 0.104 | 2.1 | None | Close to mirror face | Easy |
| * | 105 | 13 | L | −0.4 | 0.103 | 2.0 | None | Close to mirror face | Easy |
| | 106 | 13 | M | −0.3 | 0.104 | 2.1 | None | Close to mirror face | Difficult |
| | 107 | 14 | H | 0.3 | 0.158 | 5.7 | Great | Whitish | Easy |
| | 108 | 14 | I | −0.3 | 0.154 | 5.5 | Great | Whitish | Easy |
| | 109 | 14 | J | 0.2 | 0.132 | 3.2 | (Note 1) | (Note 2) | Easy |
| * | 110 | 14 | K | −1.3 | 0.111 | 2.0 | None | Close to mirror face | Easy |
| * | 111 | 14 | L | −1.5 | 0.113 | 2.1 | None | Close to mirror face | Easy |
| | 112 | 14 | M | −1.8 | 0.112 | 2.1 | None | Close to mirror face | Difficult |
| | 113 | 15 | H | 0.3 | 0.139 | 6.2 | Great | Whitish | Easy |
| | 114 | 15 | I | −0.2 | 0.137 | 6.0 | Great | Whitish | Easy |
| | 115 | 15 | J | 0.2 | 0.086 | 3.8 | (Note 1) | (Note 2) | Easy |
| * | 116 | 15 | K | −1.3 | 0.082 | 2.5 | None | Close to mirror face | Easy |
| * | 117 | 15 | L | −1.5 | 0.083 | 2.6 | None | Close to mirror face | Easy |
| | 118 | 15 | M | −1.9 | 0.083 | 2.5 | None | Close to mirror face | Difficult |

(Note 1) some adhesion to rake face
(Note 2) somewhat close to mirror face

TABLE 10

| Coated cutting insert No. | Coating No. | Processing method | Residual stress (GPa) | Amount of wear on flank face (mm) | Surface roughness Rz of work material (μm) | State of adhesion of work material to edge | State of processed surface of work material | Recognition of used state of edge |
|---|---|---|---|---|---|---|---|---|
|   | 119 | 16 | H | 0.2 | 0.148 | 5.7 | Great | Whitish | Easy |
|   | 120 | 16 | I | -0.2 | 0.146 | 5.6 | Great | Whitish | Easy |
|   | 121 | 16 | J | 0.1 | 0.121 | 3.0 | (Note 1) | (Note 2) | Easy |
| * | 122 | 16 | K | -0.4 | 0.098 | 2.1 | None | Close to mirror face | Easy |
| * | 123 | 16 | L | -0.4 | 0.096 | 2.2 | None | Close to mirror face | Easy |
|   | 124 | 16 | M | -0.3 | 0.096 | 2.2 | None | Close to mirror face | Difficult |
|   | 125 | 17 | H | 0.2 | 0.091 | 5.8 | Great | Whitish | Easy |
|   | 126 | 17 | I | -0.2 | 0.098 | 5.7 | Great | Whitish | Easy |
|   | 127 | 17 | J | 0.2 | 0.087 | 3.2 | (Note 1) | (Note 2) | Easy |
| * | 128 | 17 | K | -1.5 | 0.051 | 2.3 | None | Close to mirror face | Easy |
| * | 129 | 17 | L | -1.7 | 0.053 | 2.3 | None | Close to mirror face | Easy |
|   | 130 | 17 | M | -2.2 | 0.052 | 2.2 | None | Close to mirror face | Difficult |

(Note 1) some adhesion to rake face
(Note 2) somewhat close to mirror face

Figure 9:
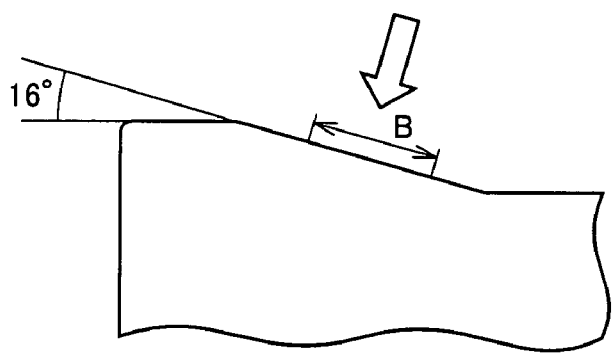
FIG. 9 is a schematic cross sectional diagram along line IX-IX of FIG. 8.

In Tables 9 and 10, items having an asterisk are examples of the present invention. Here, the outermost layer of all of the base layers is black, irrespectively of the type of coating, and as for the indicating layer, TiN is gold and TiCN is pink. In addition, the residual stress was measured in the region shown as spot B (spot size: diameter of 0.5 mm) in FIG. 8 (this region is a region in proximity to the corner, and is a portion of the inclined flat surface having an inclination angle of 16° that forms a chip breaker, as shown in FIG. 9, which shows the cross section along IX-IX of FIG. 8) in the vertical direction, shown by the arrow in FIG. 9 (perpendicular to the inclined flat surface) (the $\sin^2 \psi$ method using an X-ray stress measuring unit was adopted as a concrete measuring method). Here, this measured region is a region which relates to cutting of the rake face, and has the base layer exposed from the surface in this region in all of the examples.(processing methods K and L), and the residual stress in the uppermost layer of the base layer was measured. In contrast to this, the residual stress in respectively corresponding outermost layers was measured for each of the comparative examples. In addition, there is a region similar to this measured region in every corner, and an arbitrary one from among these was selected and measured.

As is clear from Tables 9 and 10, coated cutting inserts which are the examples of the present invention are excellent in the function of giving caution, so that recognition of the state of use of the cutting edge is easy, have an edge to which the work material do not adhere, and are excellent in terms of the surface roughness of the work material, so that the state of the work material after cutting is close to a mirror face.

In contrast, though with coated cutting inserts No. 101, 102, 107, 108, 113, 114, 119, 120, 125 and 126, it was possible to recognize the state of use of the cutting edge, a large amount of the work material adhered to the edge, the work material after cutting was whitish, and the surface roughness of the work material was poor. In addition, though the amount of adhesion of the work material to the coated cutting inserts No. 103, 109, 115, 121 and 127 is considerably low in comparison with that with the coated cutting inserts No. 101, 102, 107, 108, 113, 114, 119, 120, 125 and 126, there was some amount of adhesion to the rake face. As for the coated cutting inserts No. 106, 112, 118, 124 and 130, though the state of the work material after cutting was good, it was difficult to recognize the state of use of the cutting edge, and there was no function of giving caution.

Meanwhile, in the same manufacturing as that for coated cutting insert No. 104 that was manufactured in the above, the processing conditions (processing time and distance between the work (coated cutting insert) and the nozzle) for blasting was changed relative to the above described region (A1) and the rake face, and thereby, processing in accordance with a different blasting method was carried out or processing in accordance with a brushing method (using an SiC brush #800) was carried out in place of the blasting method, and thus, coated cutting inserts No. 104-2 to No. 104-7 were gained. That is to say, these coated cutting inserts No. 104 and No. 104-2 to 104-7 have different residual stress on region (A1) and the rake face. Here, this residual stress is measured in the rake face, in the same manner in the region of spot B in the above described FIG. 8. In addition, the residual stress of region (A1) was calculated by selecting ten points of which the processing width (distance from the cutting edge) was no less than 0.5 mm, measuring the residual stress in the outermost layer of the points having a spot size, that is, a diameter, of 0.5 mm (that is to say, in the $\alpha\text{-}Al_2O_3$ layer, which is the uppermost layer of the base layer), and finding the average value thereof.

In addition, as for the coated cutting insert No. 123, in the same manner, coated cutting inserts (No. 123-2 to No. 123-7) shown in the following Table 11, in which there was different residual stress on region (A1) and the rake face were gained.

In addition, a sequential turning cutting test was performed on these coated cutting inserts (including No. 104 and No. 123), and coated cutting inserts No. 101 and No. 119 for comparison under the same conditions as in the above (residual stress was measured in these Nos. 101, 104, 119 and 123, in the same manner as in the above described No. 104-2), and the amount of wear on the flank face was measured, and at the same time, an intermittent turning cutting test was carried out under the following conditions, and the rate of chipping of the edges was measured (this rate of chipping is shown as a percentage of the number of corners where chipping of the edge has occurred, out of 20 edges on which the test was performed). The results are shown in the following Table 11. The lower this rate of chipping is, the more superior the exhibited toughness (resistance against chipping) is.

(Conditions for Intermittent Turning Cutting Test)
  Work material: SCM440 (round rod with four trenches)
  Cutting speed: 120 m/min
  Depth of cut: 2.0 mm
  Feed: 0.40 mm/rev.
  Cutting lubricant: none
  Cutting time: 1 minute

TABLE 11

| Coated cutting insert No. | Blasting method/brushing method (note 1) | Residual stress in region (A1) (GPa) | Residual stress in rake face (GPa) | Amount of wear on flank face (mm) | Ratio of chipping of edge (%) |
|---|---|---|---|---|---|
| 101 | H | 0.2 | 0.2 | 0.161 | 90 |
| * 104 | Blasting method | −0.3 | −0.3 | 0.104 | 30 |
| * 104-2 | Blasting method | 0.0 | 0.1 | 0.105 | 65 |
| * 104-3 | Blasting method | −0.2 | −1.4 | 0.103 | 20 |
| * 104-4 | Blasting method | −1.4 | −1.8 | 0.103 | 10 |
| * 104-5 | Blasting method | −2.1 | −2.4 | 0.102 | 5 |
| * 104-6 | Brushing method | 0.1 | 0.1 | 0.100 | 65 |
| * 104-7 | Brushing method | −0.1 | −0.2 | 0.096 | 40 |
| 119 | H | 0.2 | 0.2 | 0.148 | 100 |
| * 123 | Blasting method | −0.4 | −0.4 | 0.096 | 55 |
| * 123-2 | Blasting method | 0.0 | 0.0 | 0.095 | 80 |
| * 123-3 | Blasting method | −0.2 | −1.4 | 0.094 | 45 |
| * 123-4 | Blasting method | −1.4 | −1.8 | 0.094 | 35 |
| * 123-5 | Blasting method | −2.1 | −2.4 | 0.092 | 15 |
| * 123-6 | Brushing method | 0.1 | 0.1 | 0.090 | 75 |
| * 123-7 | Brushing method | −0.1 | −0.2 | 0.089 | 50 |

(note 1) shows whether a blasting method was adopted or a brushing method was adopted when residual stress is caused in region (A1) and rake face; symbol H means that neither processing was carried out (that is to say, processing method H)
Here, compressive stress was caused in No. 104-7 and No. 123-7 in accordance with a blasting method after the removal of the indicating layer in accordance with a brushing method.
Here, an asterisk in the left column indicates examples.

As can be seen from Table 11, the toughness is excellent in the case where at least one layer that forms the base layer in at least a portion of at least either region (A1) or the region of the rake face which relates to cutting has compressive residual stress. In addition, it can be seen that the greater this compressive residual stress is, the greater the exhibited toughness becomes, and at the same time, the toughness is more excellent in the case where compressive residual stress is caused in both region (A1) and the region of the rake face which relates to cutting.

Here, items in Table 11 having an asterisk are examples, and in these examples, the work material did not adhere to the edge, and the surface of the work material was highly shiny, while in the respective comparative examples, the work material significantly adhered to the edge, and the processed surface of the work material was not at all shiny. With regard to this, the residual stress in each of the comparative examples is residual stress in the indicating layer, which is the outermost layer, which exists in this measured region.

In addition, coated cutting inserts No. 104-2, 104-6, 123-2 and 123-6 were effective in reducing the amount of wear on the flank face, preventing the work material from adhering thereto, and increasing the shininess of the processed surface of the work material, but failed to improve the toughness a great deal. That is to say, it is possible to gain, to a certain degree, the effects of increasing the toughness of an edge of a coated cutting insert by preventing the work material from adhering thereto, and it is clear that the toughness of an edge can be significantly increased by causing compressive residual stress in a certain portion of an edge, as described above.

As a result, it is clear that the coated cutting inserts which are the examples of the present invention have excellent effects in comparison with the coated cutting inserts of the respective comparative examples. Here, though the present examples show cases of coated cutting inserts where a chip breaker is formed, the present invention is also effective for coated cutting inserts where no chip breaker is formed.

Example 4

A raw material powder having a composition of 91.5 mass % of WC, 0.3 mass % of TaC, 0.2 mass % of $Cr_3C_2$ and 8.0 mass % of Co was pressed and sequentially sintered for one hour at 1400° C. in a vacuum atmosphere, and after that, edge processing was carried out on the cutting edge through honing with an SiC brush (a radius (R) of approximately 0.05 mm was added to the portion where the rake face and the flank face cross), and thereby, a cemented carbide insert having the same form as a cutting insert SEMT13T3AGSN-G (made by Sumitomo Electric Hardmetal Corporation), and this was used as the substrate. In this substrate, no beta (β) removal layer was formed on the surface, one surface was used as the rake face, and four surfaces were used as flank faces, and at the same time, the rake face and the flank faces were connected with cutting edges (virtual ridges, because edge processing has been carried out, as described above) therebetween. There were four cutting edges in total.

The following layers were formed in accordance with a known thermal CVD method in an order starting from a lower layer on the entire surface of this substrate. That is to say, 0.4 μm of TiN, 3.0 μm of TiCN (formed with MT-CVD), 2.1 μm of α alumina (α-$Al_2O_3$) and 0.3 μm of TiN, which is the outermost layer, were sequentially coated starting from the surface side of the substrate. In this coating (referred to as coating No. 18), 0.4 μm of TiN (on the surface side of the substrate), 3.0 μm of TiCN and 2.1 μm of α alumina (α-$Al_2O_3$) form the base layer (black), and 0.3 μm of TiN, which is the outermost layer, is the indicating layer (gold).

In the same manner, each of coatings No. 19 to 22 listed in the following Table 12 was coated on the entire surface of a substrate in place of this coating No. 18.

TABLE 12

| No. | Base layer | Indicating layer |
|---|---|---|
| | Coating | |
| 18 | TiN(0.4 μm)/TiCN(MT-CVD, 3.0 μm)/α-Al$_2$O$_3$(2.1 μm) | TiN(0.3 μm) |
| 19 | TiC(0.3 μm)/TiCN(MT-CVD, 1.9 μm)/TiN(0.4 μm)/κ-Al$_2$O$_3$(1.5 μm) | TiCN(0.3 μm) |
| 20 | TiN(0.3 μm)/TiCN(MT-CVD, 2.0 μm)/TiC(0.9 μm)/α-Al$_2$O$_3$(1.9 μm) | TiN(0.5 μm) |
| 21 | TiN(0.3 μm)/TiCN(MT-CVD, 2.2 μm)/TiCN(HT-CVD, 1.0 μm)/TiBN(0.3 μm)/κ-Al$_2$O$_3$(2.2 μm) | TiN(0.3 μm) |
| 22 | TiN(0.5 μm)/TiCN(MT-CVD, 2.1 μm)/TiCNO(0.2 μm)/α-Al$_2$O$_3$(2.0 μm) | TiN(0.6 μm) |

In the above described Table 12, the coatings, starting from the left, were sequentially layered on the surface of the substrate in order to form the base layer. In addition, coatings No. 19 to 22 were all formed in accordance with a known thermal CVD method, in the same manner as coating No. 18.

The following six types of processing methods N to S were respectively carried out on the substrates where these coatings were coated in accordance with a known blasting method (particles of an abrasive material: alumina sand No. 120 (average particle diameter: 100 μm), pressure: 0.3 MPa). Here, in each of the processing methods, portions where it was desired to leave the indicating layer were masked using a jig.

(Processing Method N)

No processing in accordance with a blasting method was carried out on the coating. Accordingly, the surface of the substrate showed the color of the indicating layer (gold, which is the color of TiN in the case of, for example, coating No. 18) on the entire surface.

(Processing Method O)

The indicating layer on the rake face which includes the cutting edge was removed from the coating in accordance with a blasting method. Accordingly, the entire surface of the flank face, including the cutting edge, showed. the color of the indicating layer (gold, which is the color of TiN in the case of, for example, coating No. 18), and the rake face showed the color of the base layer (black, which is the color of Al$_2$O$_3$ in the case of, for example, coating No. 18) (see FIG. 6; here, though in FIG. 6, indicating layer 13 stops before rake face 2 without extending over rake face 2, cases where the indicating layer is formed so as to extend over rake face 2 are also included in the aspect of the present processing method).

(Processing Method P)

The indicating layer on the entire surface of the flank face which includes the cutting edge was removed from the coating in accordance with a blasting method. Accordingly, the rake face showed the color of the indicating layer (gold, which is the color of TiN in the case of, for example, coating No. 18), and the entire surface of the flank face, including the cutting edge, showed the color of the base layer (black, which is the color of Al$_2$O$_3$ in the case of, for example, coating No. 18) (see FIG. 7; here, though in FIG. 7, indicating layer 13 stops before flank face 3 without extending over flank face 3, cases where the indicating layer is formed so as to extend over flank face 3 are also included in the aspect of the present processing method).

(Processing Method Q)

The indicating layer on region (A1) on the flank face, extending from the cutting edge with a distance of 0.4 mm to 0.8 mm, and on the rake face was removed from the coating in accordance with a blasting method. Accordingly, on the flank face, region (A2) excluding region (A1) extending from the cutting edge with a distance of 0.4 mm to 0.8 mm showed the color of the indicating layer (gold, which is the color of TiN in the case of, for example, coating No. 18), and region (A1) on the flank face, extending from the cutting edge with a distance of 0.4 mm to 0.8 mm, and the rake face showed the color of the base layer (black, which is the color of Al$_2$O$_3$ in the case of, for example, coating No. 18) (see FIG. 5). Here, the above described distance 0.4 mm to 0.8 mm is an average value, and this average value is in this range for the same reason as in the above described Processing Method K. With regard to this, the distance of region (A1) in portion R/2 was 0.5 mm.

(Processing Method R)

The indicating layer on region (A1) on the flank face, extending from the cutting edge with a distance of 0.3 mm to 1.2 mm, and on the rake face was removed from the coating in accordance with a blasting method. Accordingly, on the flank face, region (A2) excluding region (A1) extending from the cutting edge with a distance of 0.3 mm to 1.2 mm showed the color of the indicating layer (gold, which is the color of TiN in the case of, for example, coating No. 18), and region (A1) on the flank face, extending from the cutting edge with a distance of 0.3 mm to 1.2 mm, and the rake face showed the color of the base layer (black, which is the color of Al$_2$O$_3$ in the case of, for example, coating No. 18) (see FIG. 5). Here, the above described distance 0.3 mm to 1.2 mm is an average value, and this average value is in this range for the same reason as in the above described processing method K. With respect to this, the distance of region (A1) in portion R/2 is 0.6 mm.

(Processing Method S)

The indicating layer on the entire surface of the substrate was removed from the coating in accordance with a blasting method. Accordingly, the entire surface of the substrate (both surfaces; rake faces and flank faces) showed the color of the base layer (black, which is the color of Al$_2$O$_3$ in the case of, for example, coating No. 18).

As described above, thirty types of coated cutting inserts No. 131 to No. 160 listed in the following Tables 13 and 14 were manufactured. No. 134, 135, 140, 141, 146, 147, 152, 153, 158 and 159 are examples of the present invention, and the rest are comparative examples.

After that, a milling cutting test was performed on these coated cutting inserts No. 131 to 160 under the following conditions, and the surface roughness of the work material and the amount of wear on the flank face of the coated cutting insert were measured. In addition, the state of adhesion of the work material to the edge after cutting of 0.1 m, the state of the processed surface of the work material, and the recognizability of the state of use of the cutting edge were respectively observed. The results are shown in the following Tables 13 and 14. The smaller the numerical value of the surface roughness (Rz; JIS B0601: 2001) of the work material is, the better the exhibited smoothness is, and the smaller the numerical value of the amount of wear on the flank face is, the better the exhibited wear resistance is. In addition, the greater the amount of adhesion of the work material to the edge is, the worse the exhibited surface roughness of the work material, and the closer to the mirror surface the state of the processed surface of the work material is, the better the state of the processed surface of the work material is.

(Conditions for Milling Cutting Test)
  Work material: block material of SKD11
  Cutting speed: 150 m/min
  Feed: 0.16 mm/rev.
  Depth of Cut: 2.0 mm
  Cutting Lubricant: none
  Cutting Length: 1 m
  Cutter: WGC4160R (made by Sumitomo Electric Hardmetal Corporation)

The number of coated cutting inserts which were attached to the above described cutter was 1.

Figure 10:
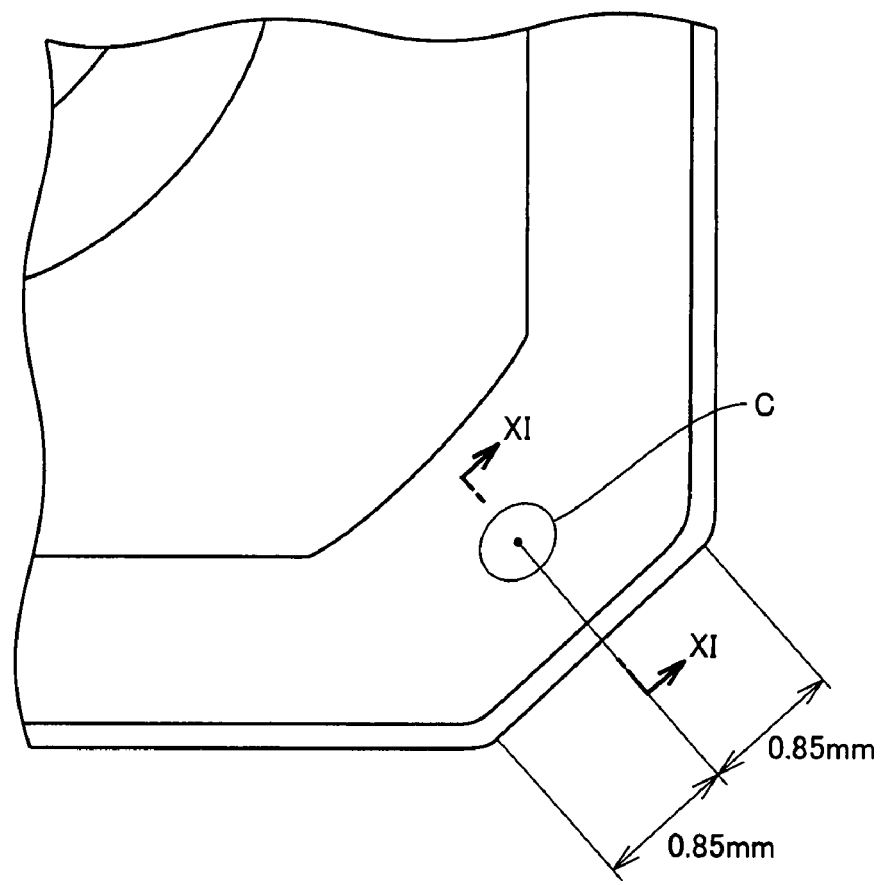
FIG. 10 is a schematic plan diagram showing one corner portion of a coated cutting insert.
Figure 11:
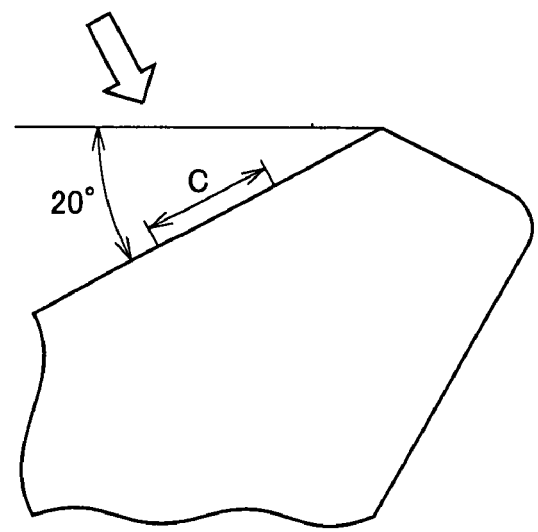
FIG. 11 is a schematic cross sectional diagram along line XI-XI of FIG. 10.

In Tables 13 and 14, items having an asterisk are examples of the present invention. Here, the outermost layer of all of the base layers is black, irrespectively of the type of coating, and as for the indicating layer, TiN is gold and TiCN is pink. In addition, the residual stress was measured in the region shown as spot C (spot size: diameter of 0.5 mm) in FIG. 10 (this region is a region in proximity to the corner, and is a portion of the inclined flat surface having an inclination angle of 20° that forms a chip breaker, as shown in FIG. 11, which shows the cross section along XI-XI of FIG. 10) in the vertical direction, shown by the arrow in FIG. 11 (perpendicular to the inclined flat surface) (the $\sin^2 \psi$ method using an X-ray stress measuring unit was adopted as a concrete measuring method). Here, this measured region is a region which relates to cutting of the rake face, and has the base layer exposed from the surface in this region in all of the examples (processing methods Q and R), and the residual stress in the uppermost layer of the base layer was measured. In contrast to this,

TABLE 13

| | Coated cutting insert No. | Coating No. | Processing method | Residual stress (GPa) | Amount of wear on flank face (mm) | Surface roughness Rz of work material (μm) | State of adhesion of work material to edge | State of processed surface of work material | Recognition of used state of edge |
|---|---|---|---|---|---|---|---|---|---|
| | 131 | 18 | N | 0.2 | 0.224 | 3.4 | Great | Whitish | Easy |
| | 132 | 18 | O | −0.3 | 0.219 | 3.3 | Great | Whitish | Easy |
| | 133 | 18 | P | 0.2 | 0.194 | 2.6 | (Note 1) | (Note 2) | Easy |
| * | 134 | 18 | Q | −0.4 | 0.123 | 1.9 | None | Close to mirror face | Easy |
| * | 135 | 18 | R | −0.5 | 0.121 | 1.8 | None | Close to mirror face | Easy |
| | 136 | 18 | S | −0.4 | 0.122 | 1.9 | None | Close to mirror face | Difficult |
| | 137 | 19 | N | 0.2 | 0.220 | 3.5 | Great | Whitish | Easy |
| | 138 | 19 | O | −0.3 | 0.216 | 3.4 | Great | Whitish | Easy |
| | 139 | 19 | P | 0.1 | 0.189 | 2.6 | (Note 1) | (Note 2) | Easy |
| * | 140 | 19 | Q | −1.4 | 0.122 | 1.9 | None | Close to mirror face | Easy |
| * | 141 | 19 | R | −1.6 | 0.120 | 1.9 | None | Close to mirror face | Easy |
| | 142 | 19 | S | −1.7 | 0.121 | 1.8 | None | Close to mirror face | Difficult |
| | 143 | 20 | N | 0.2 | 0.203 | 3.6 | Great | Whitish | Easy |
| | 144 | 20 | O | −0.1 | 0.201 | 3.5 | Great | Whitish | Easy |
| | 145 | 20 | P | 0.2 | 0.196 | 2.5 | (Note 1) | (Note 2) | Easy |
| * | 146 | 20 | Q | −1.5 | 0.110 | 1.8 | None | Close to mirror face | Easy |
| * | 147 | 20 | R | −1.6 | 0.109 | 1.9 | None | Close to mirror face | Easy |
| | 148 | 20 | S | −2.0 | 0.112 | 1.9 | None | Close to mirror face | Difficult |

(Note 1) some adhesion to rake face
(Note 2) somewhat close to mirror face

TABLE 14

| | Coated cutting insert No. | Coating No. | Processing method | Residual stress (GPa) | Amount of wear on flank face (mm) | Surface roughness Rz of work material (μm) | State of adhesion of work material to edge | State of processed surface of work material | Recognition of used state of edge |
|---|---|---|---|---|---|---|---|---|---|
| | 149 | 21 | N | 0.2 | 0.220 | 3.6 | Great | Whitish | Easy |
| | 150 | 21 | O | −0.1 | 0.216 | 3.5 | Great | Whitish | Easy |
| | 151 | 21 | P | 0.2 | 0.188 | 2.6 | (Note 1) | (Note 2) | Easy |
| * | 152 | 21 | Q | −0.3 | 0.123 | 1.9 | None | Close to mirror face | Easy |
| * | 153 | 21 | R | −0.5 | 0.121 | 1.8 | None | Close to mirror face | Easy |
| | 154 | 21 | S | −0.5 | 0.122 | 1.8 | None | Close to mirror face | Difficult |
| | 155 | 22 | N | 0.2 | 0.202 | 3.7 | Great | Whitish | Easy |
| | 156 | 22 | O | −0.1 | 0.198 | 3.6 | Great | Whitish | Easy |
| | 157 | 22 | P | 0.2 | 0.194 | 2.4 | (Note 1) | (Note 2) | Easy |
| * | 158 | 22 | Q | −1.6 | 0.105 | 1.9 | None | Close to mirror face | Easy |
| * | 159 | 22 | R | −1.7 | 0.104 | 1.9 | None | Close to mirror face | Easy |
| | 160 | 22 | S | −2.1 | 0.106 | 1.8 | None | Close to mirror face | Difficult |

(Note 1) some adhesion to rake face
(Note 2) somewhat close to mirror face the residual stress in respectively corresponding outermost layers was measured for each of the comparative examples. In addition, there is a region similar to this measured region in every corner, and an arbitrary one from among these was selected and measured.

As is clear from Tables 13 and 14, coated cutting inserts which are the examples of the present invention are excellent in the function of giving caution, so that recognition of the state of use of the cutting edge is easy, have an edge to which the work material do not adhere, and are excellent in terms of the surface roughness of the work material, so that the state of the work material after cutting is close to a mirror face.

In contrast, though with coated cutting inserts No. 131, 132, 137, 138, 143, 144, 149, 150, 155 and 156, it was possible to recognize the state of use of the cutting edge, a large amount of the work material adhered to the edge, the work material after cutting was whitish, and the surface roughness of the work material was poor. In addition, though the amount of adhesion of the work material to the coated cutting inserts No. 133, 139, 145, 151 and 157 is considerably low in comparison with that with the above described coated cutting inserts No. 131, 132, 137, 138, 143, 144, 149, 150, 155 and 156, there was some amount of adhesion to the rake face. As for the coated cutting inserts No. 136, 142, 148, 154 and 160, though the state of the work material after cutting was good, it was difficult to recognize the state of use of the cutting edge, and there was no function of giving caution Meanwhile, in the same manufacturing method as that for coated cutting insert No. 152 that was manufactured in the above, processing in accordance with a different blasting method on a different processing conditions for blasting (processing time and distance between the work (coated cutting insert) and the nozzle) or processing in accordance with a brushing method (using an SiC brush #800) in place of the blasting method was performed to the above described region (A1) and the rake face, and thus, coated cutting inserts No. 152-2 to No. 152-7 were gained. That is to say, these coated cutting inserts No. 152 and No. 152-2 to 152-7 have different residual stress on region (A1) and the rake face. Here, this residual stress is measured in the rake face, in the same manner in the region of spot C in the above described FIG. 10. In addition, the residual stress of region (A1) was calculated by selecting ten points of which the processing width (distance from the cutting edge) was no less than 0.5 mm, measuring the residual stress in the outermost layer of the points having a spot size, that is, a diameter, of 0.5 mm (that is to say, in the $\kappa$-$Al_2O_3$ layer, which is the uppermost layer of the base layer), and finding the average value thereof.

In addition, as for the coated cutting insert No. 159, in the same manner, coated cutting inserts (No. 159-2 to No. 159-7) shown in the following Table 15, in which there was different residual stress on region (A1) and the rake face were gained.

In addition, a milling cutting test (for wear resistance) was performed on these coated cutting inserts (including No. 152 and No. 159), and coated cutting inserts No. 149 and No. 155 for comparison under the same conditions as in the above (residual stress was measured in these Nos. 149, 152, 155 and 159, in the same manner as in the above described No. 152-2 or the like), and the amount of wear on the flank face was measured, and at the same time, a milling cutting test (for toughness) was carried out under the following conditions, and the rate of chipping of the edges was measured (this rate of chipping is shown as a percentage of the number of corners where chipping of the edge has occurred, out of 20 edges on which the test was performed). The results are shown in the following Table 15. The lower this rate of chipping is, the more superior the exhibited toughness (property of resistance against chipping).

(Conditions for Milling Cutting Test) . . . for Toughness

Work material: SCM435 (three-layered block material)

Cutting speed: 170 m/min

Depth of cut: 2.0 mm

Feed: 0.40 mm/rev.

Cutting lubricant: none

Cutting Distance: 0.5 m

Cutter: WGC4160R (made by Sumitomo Electric Hardmetal Corporation)

The number of coated cutting inserts which are attached to the above described cutter was 1.

TABLE 15

| Coated cutting insert No. | Blasting method/brushing method (note 1) | Residual stress in region (A1) (GPa) | Residual stress in rake face (GPa) | Amount of wear on flank face (mm) | Ratio of chipping of edge (%) |
|---|---|---|---|---|---|
| 149 | N | 0.2 | 0.2 | 0.220 | 95 |
| * 152 | Blasting method | −0.2 | −0.3 | 0.123 | 35 |
| * 152-2 | Blasting method | 0.1 | 0.0 | 0.122 | 60 |
| * 152-3 | Blasting method | −0.3 | −1.5 | 0.123 | 25 |
| * 152-4 | Blasting method | −1.3 | −1.7 | 0.121 | 10 |
| * 152-5 | Blasting method | −2.2 | −2.5 | 0.120 | 5 |
| * 152-6 | Brushing method | 0.1 | 0.2 | 0.121 | 60 |
| * 152-7 | Brushing method | −0.2 | −0.2 | 0.118 | 35 |
| 155 | N | 0.2 | 0.2 | 0.202 | 100 |
| * 159 | Blasting method | −0.3 | −0.3 | 0.104 | 60 |
| * 159-2 | Blasting method | 0.0 | 0.0 | 0.103 | 85 |
| * 159-3 | Blasting method | −0.4 | −1.6 | 0.105 | 45 |
| * 159-4 | Blasting method | −1.5 | −1.9 | 0.103 | 30 |
| * 159-5 | Blasting method | −2.1 | −2.6 | 0.101 | 10 |
| * 159-6 | Brushing method | 0.1 | 0.2 | 0.100 | 70 |
| * 159-7 | Brushing method | −0.1 | −0.2 | 0.099 | 45 |

(note 1) shows whether a blasting method was adopted or a brushing method was adopted when residual stress is caused in region (A1) and rake face; symbol N means that neither processing was carried out (that is to say, processing method N)
Here, compressive stress was caused in No. 152-7 and No. 159-7 in accordance with a blasting method after the removal of the indicating layer in accordance with a brushing method.
Here, an asterisk in the left column indicates examples.

It can be clearly seen from Table 15 that the toughness is excellent in the case where at least one layer that forms the base layer in at least a portion of at least either region (A1) or the region of the rake face which relates to cutting has compressive residual stress. In addition, the greater this compressive residual stress is, the more excellent the exhibited toughness is, and at the same time, and it can be seen that the toughness is more excellent in the case where compressive residual stress is caused in both region (A1) and the region of the rake face which relates to cutting.

Here, items in Table 15 having an asterisk are examples, and in these examples, the work material did not adhere to the edge, and the surface of the work material was highly shiny, while in the respective comparative examples, the work material significantly adhered to the edge, and the processed surface of the work material was not at all shiny. With regard to this, the residual stress in each of the comparative examples is residual stress in the indicating layer, which is the outermost layer, which exists in this measured region.

In addition, coated cutting inserts No. 152-2, 152-6, 159-2 and 159-6 were effective in reducing the amount of wear on the flank face, preventing the work material from adhering thereto, and increasing the shininess of the processed surface of the work material, but failed to improve the toughness a great deal. That is to say, it is possible to gain, to a certain degree, the effects of increasing the toughness of an edge of a coated cutting insert by preventing the work material from adhering thereto, and it is clear that the toughness of an edge can be significantly increased by causing compressive residual stress in a certain portion of an edge, as described above.

As a result, it is clear that the coated cutting inserts which are the examples of the present invention have excellent effects in comparison with the coated cutting inserts of the respective comparative examples. Here, though the present examples show cases of coated cutting inserts where a chip breaker is formed, the present invention is also effective for coated cutting inserts where no chip breaker is formed.

Here, though in each of the above described examples, coated cutting inserts for turning and milling are shown, the present invention can, of course, be applied with the same effects to coated cutting inserts for drilling processing, coated cutting inserts for end milling, coated cutting inserts for metal saw processing, coated cutting inserts for gear cutting tool processing, coated cutting inserts for reamer processing, coated cutting inserts for tap processing, and coated cutting inserts for pin milling on crankshafts.

The embodiments and examples which are disclosed herein are illustrative in all respects, and should not be considered as limitative. The scope of the present invention is not defined by the above description, but by the claims, and is intended to include meanings equivalent to the claims and all modifications within the scope.

The invention claimed is:

1. A coated cutting insert, comprising:
a substrate;
a base layer formed on the substrate; and
an indicating layer formed on a portion of the base layer, wherein in said substrate, at least one surface serves as a rake face, at least one other surface serves as a flank face, and a ridge where the rake face and the flank face cross serves as a cutting edge,
said base layer has a color which is different from that of said indicating layer,
said indicating layer is formed on said flank face and on said base layer, the indicating layer is formed over an entirety of a region A2 or a portion of A2, and the indicating layer is not formed on a region A1 extending from said cutting edge in a vertical direction with a distance of no less than 0.2 mm and less than 3.0 mm, and
said region A2 is a region excluding said region A1 from said flank face.

2. The coated cutting insert according to claim 1, characterized in that said base layer is exposed at said region and said rake face, and at least one layer that constitutes said exposed base layer has compressive residual stress in at least a portion of at least one of said region A1 and the region on said rake face which relates to cutting.

3. The coated cutting insert according to claim 2, characterized in that said compressive residual stress is stress of which the absolute value is no less than 0.1 GPa.

4. The coated cutting insert according to claim 1, characterized in that a relation of 1.0>A/B is established, when the surface roughness Ra of said region is A μm and the surface roughness Ra of said region A2 is B μm.

5. The coated cutting insert according to claim 1, characterized in that said coated cutting insert has a plurality of cutting edges.

6. The coated cutting insert according to claim 1, characterized in that said indicating layer is a layer which is easily worn in comparison with said base layer.

7. The coated cutting insert according to claim 1, characterized in that an outermost layer of said base layer is formed of an $Al_2O_3$ layer or a layer that includes $Al_2O_3$.

8. The coated cutting insert according to claim 1, characterized in that
an outermost layer of said indicating layer is formed by a layer either that is composed of at least one type of metal (element) selected from the group consisting of the elements of the IVa group, the elements of the Va group, and the elements of the VIa group in the periodic table of elements, Al, Si, Cu, Pt, Au, Ag, Pd, Fe, Co and Ni, or an alloy that includes the metal, or that is formed of a compound of at least one type of element selected from the group consisting of the elements of the IVa group, the elements of the Va group, and the elements of the VIa group in the periodic table of elements, Al and Si, and at least one type of element selected from the group consisting of carbon, nitrogen, oxygen and boron.

9. The coated cutting insert according to claim 1, characterized in that said substrate is formed of any of a cemented carbide, a cermet, a high-speed steel, a ceramic, a cubic boron nitride sintered body, a diamond sintered body, a silicon nitride sintered body and a mixture of aluminum oxide and titanium carbide.

10. The coated cutting insert according to claim 1, characterized in that said coated cutting insert is any of a drill, an end mill, a coated insert for milling or turning, a metal saw, a gear cutting tool, a reamer, a tap and an insert for pin milling on a crankshaft.

\* \* \* \* \*